US011107802B2

(12) United States Patent
Nakaki

(10) Patent No.: US 11,107,802 B2
(45) Date of Patent: Aug. 31, 2021

(54) SEMICONDUCTOR DEVICE AND METHOD OF MANUFACTURING THE SAME

(71) Applicant: Toshiba Memory Corporation, Minato-ku (JP)

(72) Inventor: Hiroshi Nakaki, Yokkaichi (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/541,370

(22) Filed: Aug. 15, 2019

(65) Prior Publication Data
US 2020/0286876 A1 Sep. 10, 2020

(30) Foreign Application Priority Data

Mar. 4, 2019 (JP) .............................. JP2019-038765

(51) Int. Cl.
| | |
|---|---|
| *H01L 27/115* | (2017.01) |
| *H01L 25/18* | (2006.01) |
| *H01L 25/065* | (2006.01) |
| *H01L 25/00* | (2006.01) |
| *H01L 23/00* | (2006.01) |
| *H01L 27/11582* | (2017.01) |

(52) U.S. Cl.
CPC .............. *H01L 25/18* (2013.01); *H01L 24/08* (2013.01); *H01L 24/80* (2013.01); *H01L 25/0657* (2013.01); *H01L 25/50* (2013.01); *H01L 27/11582* (2013.01); *H01L 2224/08145* (2013.01); *H01L 2224/80006* (2013.01); *H01L 2224/80894* (2013.01); *H01L 2225/06524* (2013.01); *H01L 2924/1431* (2013.01); *H01L 2924/14511* (2013.01)

(58) Field of Classification Search
CPC ....................... H01L 27/11582; G11C 16/0483
See application file for complete search history.

(56) References Cited

U.S. PATENT DOCUMENTS

| | | | |
|---|---|---|---|
| 8,198,670 | B2 | 6/2012 | Aoyama |
| 8,217,446 | B2 | 7/2012 | Fukuzumi et al. |
| 8,912,594 | B2 | 12/2014 | Fujiki et al. |
| 9,508,731 | B2 | 11/2016 | Wolstenholme |

(Continued)

FOREIGN PATENT DOCUMENTS

| | | |
|---|---|---|
| JP | 2010-219409 A | 9/2010 |
| JP | 2013-187337 A | 9/2013 |

(Continued)

*Primary Examiner* — Matthew L Reames
(74) *Attorney, Agent, or Firm* — Oblon, McClelland, Maier & Neustadt, L.L.P.

(57) ABSTRACT

In one embodiment, a semiconductor device includes a first substrate, and a plurality of electrode layers provided above the first substrate and stacked in a first direction. The device further includes a first semiconductor layer extending in the first direction in the plurality of electrode layers, and a metal layer provided above an uppermost one of the plurality of electrode layers and extending to cross the first direction. The device further includes a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer.

12 Claims, 23 Drawing Sheets

(56) References Cited

U.S. PATENT DOCUMENTS

| | | | |
|---|---|---|---|
| 9,929,178 B1 | 3/2018 | Kaneko | |
| 2010/0159657 A1* | 6/2010 | Arai | H01L 27/105 |
| | | | 438/268 |
| 2016/0372481 A1 | 12/2016 | Izumida et al. | |
| 2017/0179154 A1* | 6/2017 | Furihata | H01L 21/76802 |
| 2018/0190669 A1 | 7/2018 | Kaneko | |

FOREIGN PATENT DOCUMENTS

| | | |
|---|---|---|
| JP | 5364342 B2 | 12/2013 |
| JP | 2018-041907 A | 3/2018 |

\* cited by examiner

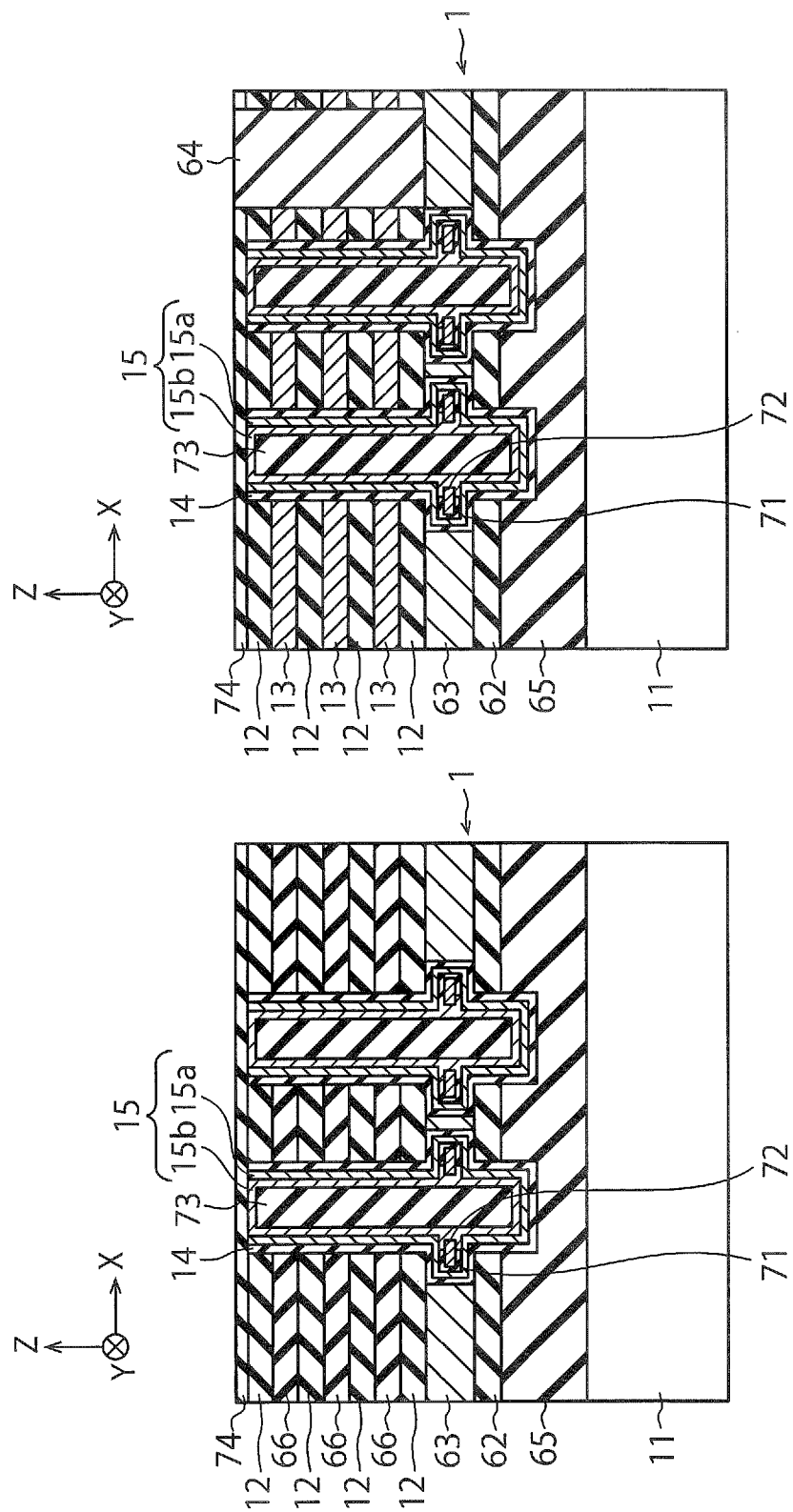

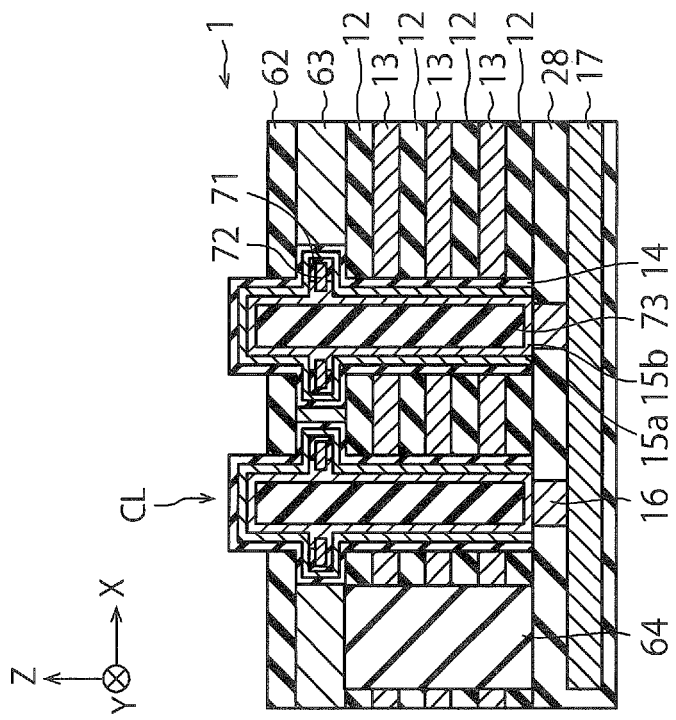
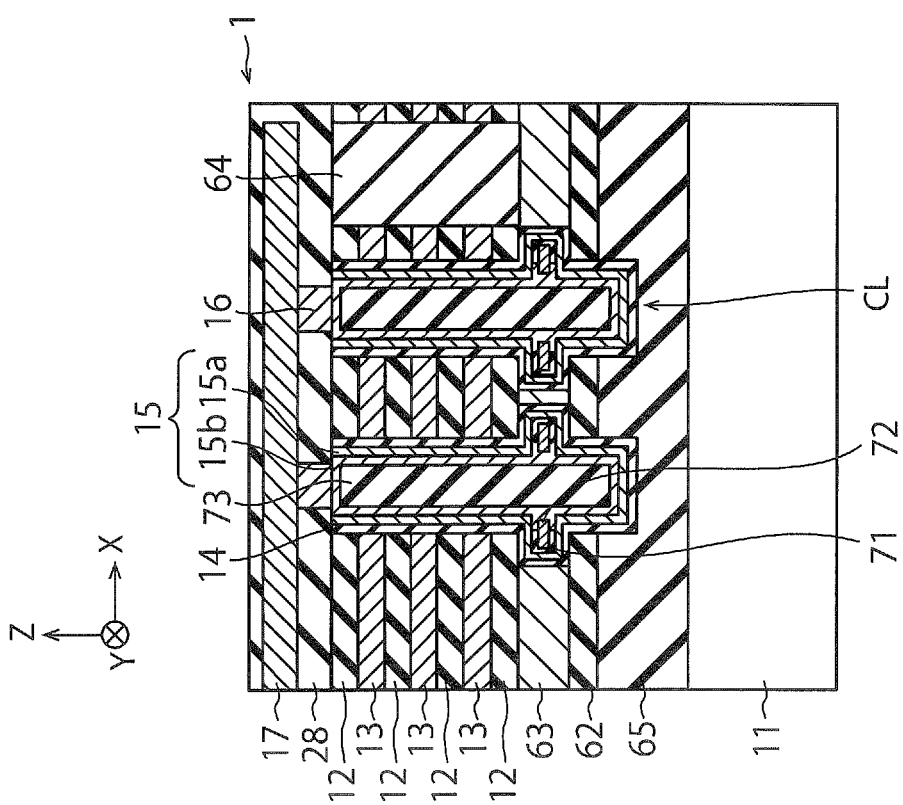
FIG. 21A
FIG. 21B

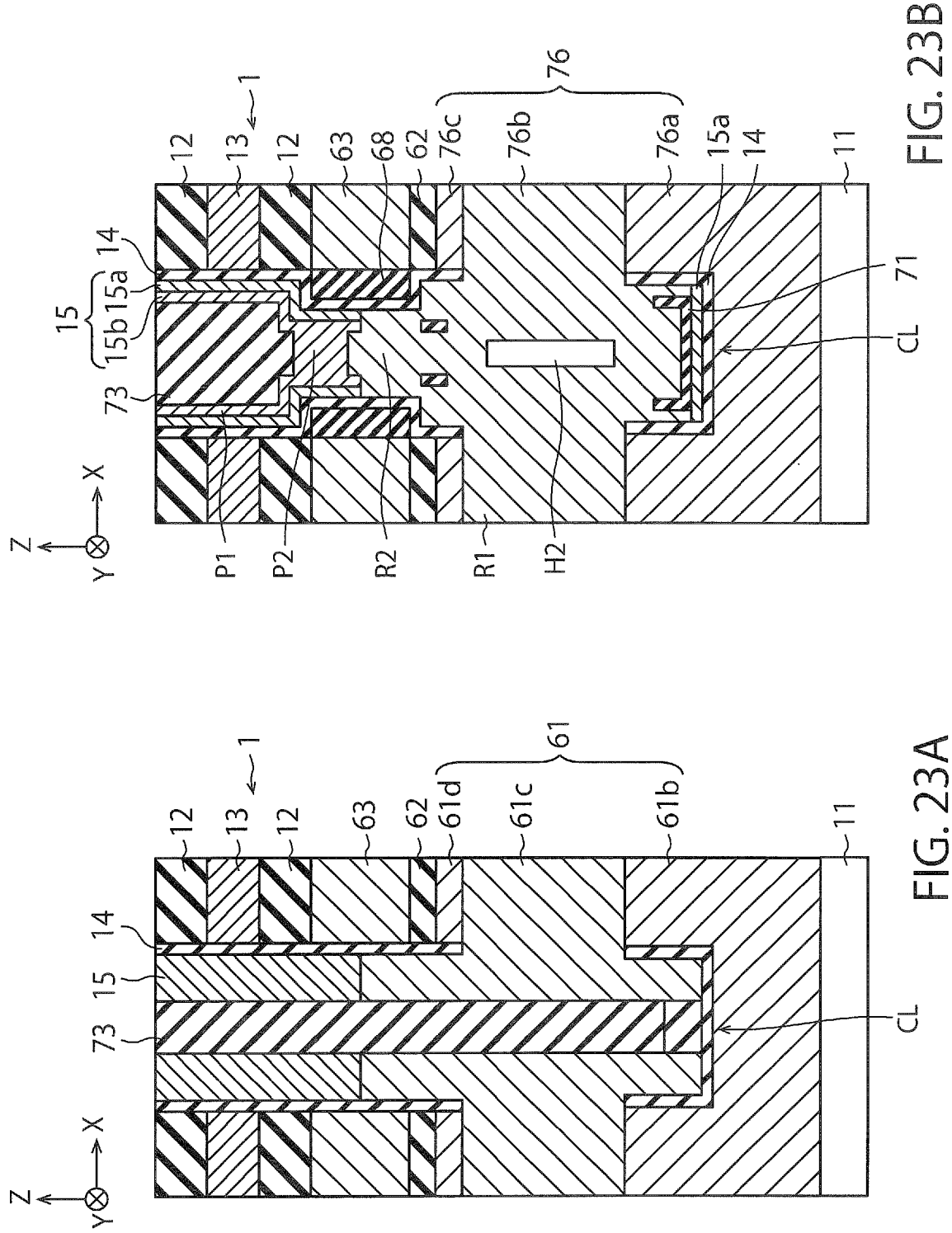

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-038765, filed on Mar. 4, 2019, the entire contents of which are incorporated herein by reference.

FIELD

Embodiments described herein relate to a semiconductor device and a method of manufacturing the same.

BACKGROUND

In a semiconductor device having a fine and complex structure like a three-dimensional memory, it is a big problem how to connect an interconnection layer with a channel semiconductor layer forming a memory cell. In general, when the three-dimensional memory is manufactured, a sacrificial layer is formed on a substrate and then the sacrificial layer is replaced with the interconnection layer (replacement process) to form the memory cell. However, if the sacrificial layer is to be replaced with, for example, a source layer that is to become the interconnection layer, it may be difficult to appropriately perform the replacement process to connect the memory cell with the source layer.

BRIEF DESCRIPTION OF THE DRAWINGS

FIGS. 18A to 22B are sectional views showing a method of manufacturing a semiconductor device of a fourth embodiment;

FIGS. 23A and 23B are sectional views explaining a method of manufacturing a semiconductor device of a fifth embodiment.

DETAILED DESCRIPTION

Figure 1A:
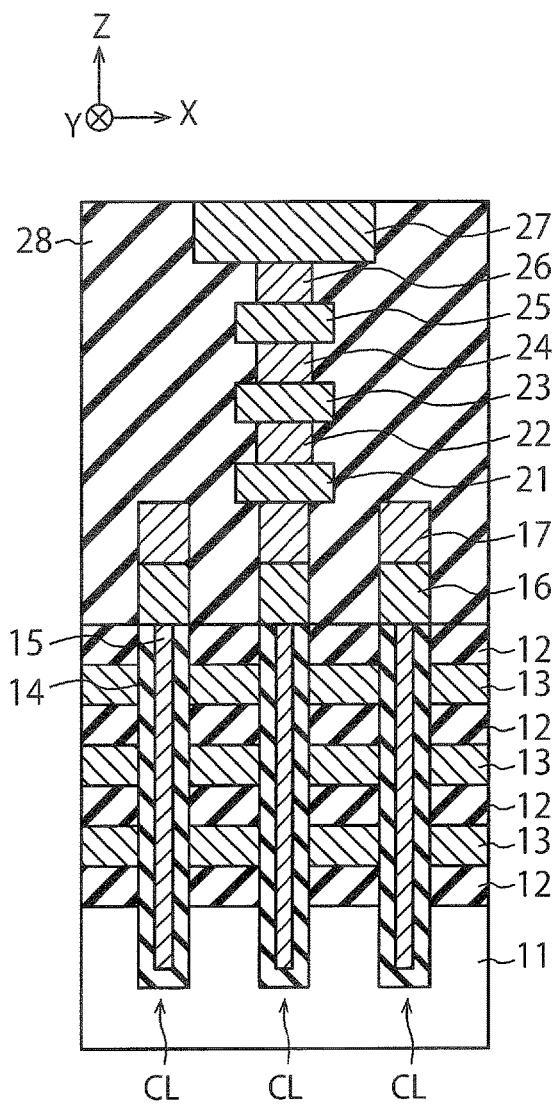
FIGS. 1A to 2B are sectional views showing a method of manufacturing a semiconductor device of a first embodiment.

In one embodiment, a semiconductor device includes a first substrate, and a plurality of electrode layers provided above the first substrate and stacked in a first direction. The device further includes a first semiconductor layer extending in the first direction in the plurality of electrode layers, and a metal layer provided above an uppermost one of the plurality of electrode layers and extending to cross the first direction. The device further includes a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer.

Embodiments will now be explained with reference to the accompanying drawings. In FIGS. 1A to 24B, the same or similar components are denoted by the same reference numerals, and redundant description thereof will be omitted.

First Embodiment

FIGS. 1A to 2B are sectional views showing a method of manufacturing a semiconductor device of a first embodiment. The semiconductor device of the present embodiment is manufactured by bonding an array wafer 1 to the circuit wafer 2.

First, the array wafer 1 shown in FIG. 1A is prepared. FIG. 1A shows a substrate 11 and various layers formed on the substrate 11. The substrate 11 is, for example, a semiconductor substrate such as a silicon substrate. FIG. 1A shows an X direction and a Y direction perpendicular to each other and parallel to a surface of the substrate 11 as well as shows a Z direction perpendicular to the surface of the substrate 11. The X direction, Y direction, and Z-direction are orthogonal to one another. In the present specification, a +Z direction is treated as an upward direction and −Z direction is treated as a downward direction. The −Z direction may or may not coincide with the gravity direction. The Z direction is an example of a first direction.

The array wafer 1 is manufactured, for example, as follows.

First, plural insulating layers 12 and plural electrode layers 13 are formed alternately on the substrate 11. Consequently, the electrode layers 13 are stacked to be spaced away from one another in the Z direction that crosses the surface of the substrate 11, and are shaped to spread in the X direction and Y direction. The insulating layers 12 are, for example, silicon oxide films. The electrode layers 13 are, for example, W (tungsten) layers and function as control electrodes for selection gate lines and the like used to select word lines and memory arrays. Next, plural columnar portions CL each having a columnar shape extending in the Z direction are formed in the insulating layers 12 and electrode layers 13. The columnar portions CL are formed by forming respective memory holes that penetrate the insulating layers 12 and electrode layers 13 and forming memory insulators 14 and channel semiconductor layers 15 in the memory holes in sequence. The channel semiconductor layers 15 are an example of first semiconductor layers. The electrode layers 13, memory insulators 14, and channel semiconductor layers 15 make up a memory cell array. That is, the plural columnar portions CL are provided by being arranged in an array when viewed from above the substrate 11. In other words, the columnar portions CL are provided by being arranged in an array in an in-plane direction of the electrode layers 13.

FIG. 1A further shows contact plugs 16, via plugs 17, an interconnection layer 21, a via plug 22, an interconnection layer 23, a via plug 24, an interconnection layer 25, and a via plug 26 formed in sequence on the channel semiconductor layers 15 and the like. These plugs and interconnection layers are, for example, metal plugs and metal layers, respectively, and are formed of Cu (copper), an alloy composed principally of Cu, W (tungsten), an alloy composed principally of W, or another substance. FIG. 1A further shows a metal pad 27 formed on the via plug 26 and an inter layer dielectric 28 formed covering the plugs and interconnection layers. The metal pad 27 is formed, for example, of Cu (copper) or an alloy composed principally of Cu. In FIG. 1A, the interconnection layer 21 functions, for example, as a bit line. In FIG. 1A, adjacent bit lines in the interconnection layer 21 are not shown.

The electrode layers 13 may be formed by a replacement process. In this case, the plural insulating layers 12 and plural sacrificial layers are formed alternately on the substrate 11 and plural columnar portions CL are formed in the insulating layers 12 and sacrificial layers. Subsequently, the sacrificial layers are removed and plural cavities between the insulating layers 12 formed thereby are embedded with the plural electrode layers 13. In this way, the sacrificial layers are replaced with the electrode layers 13. Examples of the sacrificial layers include insulating layers, such as silicon nitride films, different from the insulating layers 12.

Figure 1B:
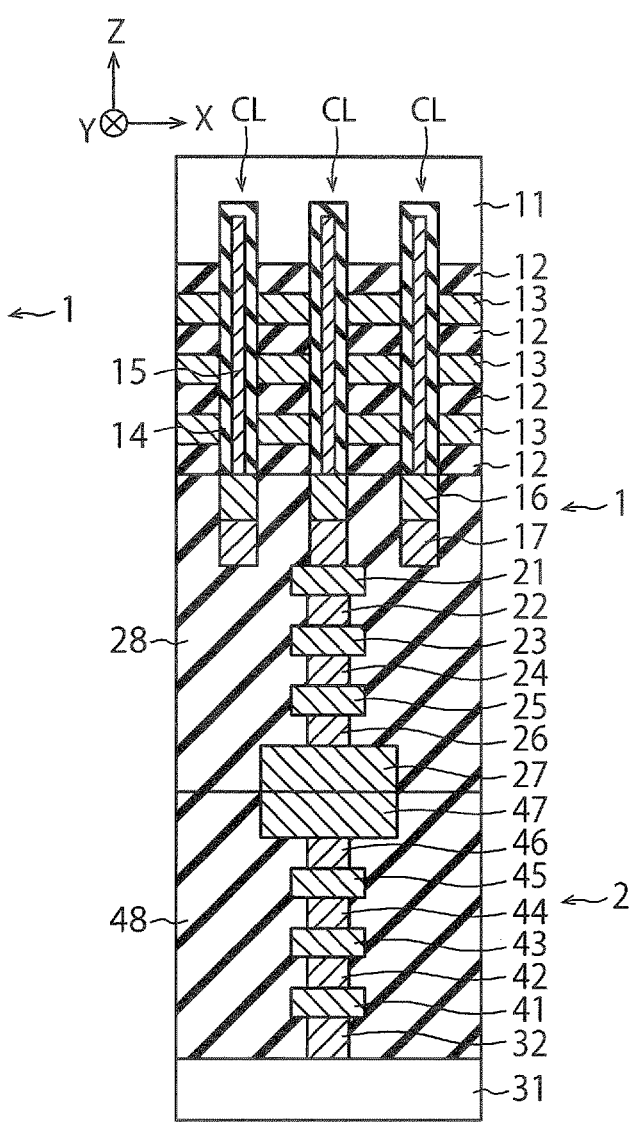

Next, the circuit wafer 2 shown in FIG. 1B is prepared and the array wafer 1 is bonded to the circuit wafer 2. The circuit wafer 2 includes a logic circuit adapted to control operation of the semiconductor device of the present embodiment. The circuit wafer 2 is an example of a first wafer and the array wafer 1 is an example of a second wafer.

In bonding the array wafer 1 to the circuit wafer 2, the array wafer 1 shown in FIG. 1A is turned upside down and then the array wafer 1 is bonded to the circuit wafer 2. Here, the +Z direction is treated as an upward direction and −Z direction is treated as a downward direction as described above, and so the X, Y, and Z directions are considered as being fixed in space around the array wafer 1 and circuit wafer 2. Therefore, whereas the columnar portions CL of FIG. 1A are located in the +Z direction of the substrate 11, the columnar portions CL of FIG. 1B are located in the −Z direction of the substrate 11. The X, Y, and Z directions are treated in this way not only in the first embodiment, but also in other embodiments described later.

The circuit wafer 2 is configured such that plural elements (not shown) such as MOS transistors making up a logic circuit are formed on a substrate 31 made of a semiconductor such as silicon and a contact plug 32 is formed on a diffusion layer of the elements on the substrate 31.

As shown in FIG. 1B, the circuit wafer 2 further includes plural interconnection layers 41, 43, and 45, plural via plugs 42, 44, and 46, and a metal pad 47. The plural plugs and interconnection layers are, for example, metal plugs and metal layers, respectively, and are formed, for example, of Cu (copper), an alloy composed principally of Cu, W (tungsten), an alloy composed principally of W (tungsten), or another substance. FIG. 1B further shows the metal pad 47 formed on the via plug 46 and an inter layer dielectric 48 formed covering the plugs and interconnection layers. The metal pad 47 is formed, for example, of Cu or an alloy composed principally of Cu.

The array wafer 1 is bonded to the circuit wafer 2 by adhering the inter layer dielectric 28 and the inter layer dielectric 48 with each other by the application of mechanical pressure to these wafers and then annealing the contacted array wafer 1 and circuit wafer 2, thereby joining the metal pad 27 and the metal pad 47 with each other. Here, the electrode layers 13, memory insulators 14, and channel semiconductor layers 15 are located above the substrate 31. The substrate 31 is an example of a first substrate and the substrate 11 is an example of a second substrate.

Although FIG. 1B clearly shows a boundary surface between the inter layer dielectric 28 and inter layer dielectric 48 and a boundary surface between the metal pad 27 and metal pad 47, the boundary surfaces may no longer be observed after the annealing. However, locations where the boundary surfaces existed can be estimated by detecting, for example, inclinations of a side face of the metal pad 27 and a side face of the metal pad 47 (the side faces spread on the boundary side) or displacement between the side face of the metal pad 27 and metal pad 47 (a displacement surface is on the boundary side).

Figure 2A:
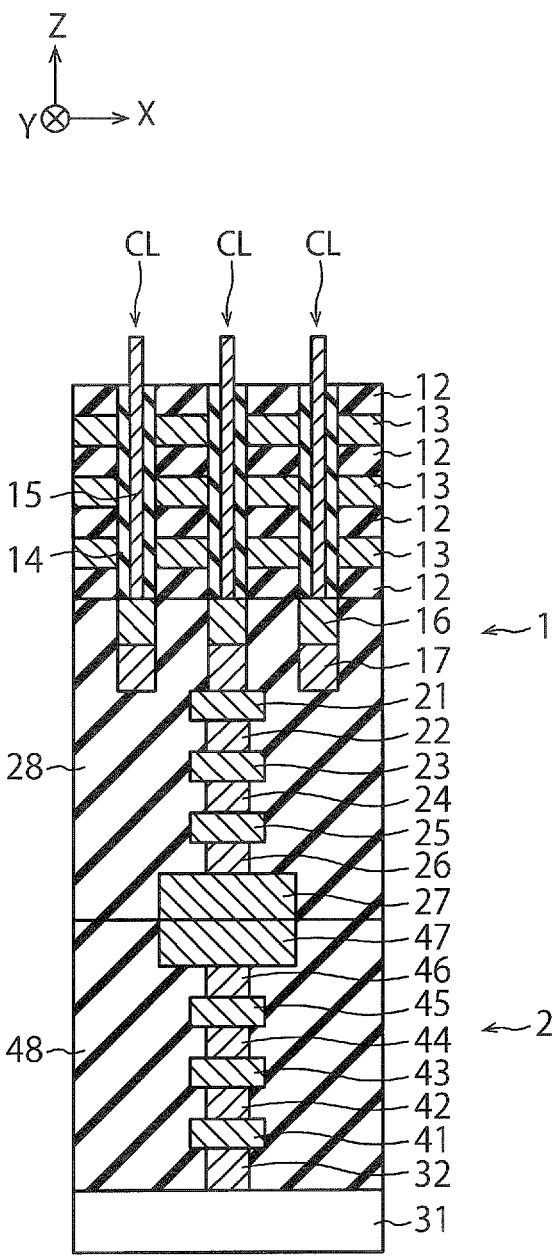

Next, the substrate 11 is removed from the array wafer 1 (FIG. 2A). The substrate 11 is removed, for example, by etching or CMP (Chemical Mechanical Polishing). In so doing, that portion of the memory insulator 14 which is located at a position higher than an upper surface of the uppermost insulating layer 12 is also removed. As a result, respective surfaces of the plural channel semiconductor layers 15 are exposed.

Figure 2B:
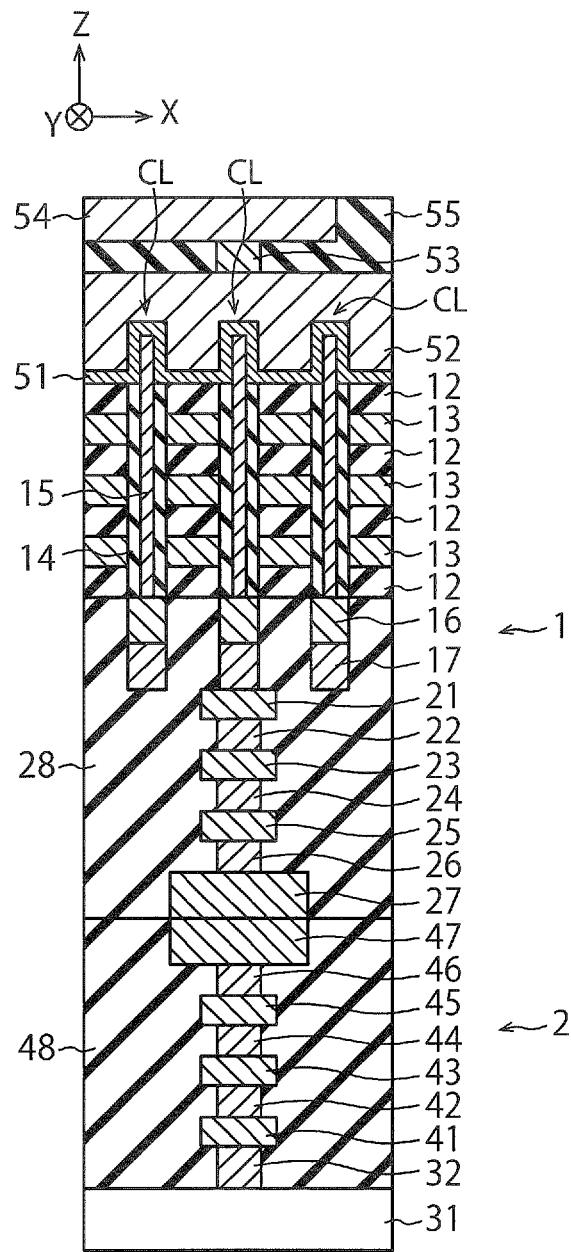

Next, a diffusion layer 51 and metal layer 52 are formed in sequence on an entire surface of the substrate 31 (FIG. 2B). As a result, the diffusion layer 51 is formed on surfaces of the channel semiconductor layers 15 and the upper surface of the uppermost insulating layer 12 and electrically connected to the channel semiconductor layers 15. Furthermore, the metal layer 52 is formed on the diffusion layer 51 and electrically connected to the diffusion layer 51. The diffusion layer 51 is shaped to spread in the X direction and Y direction as a whole, and so do the metal layer 52. The diffusion layer 51 is shaped to surround the channel semiconductor layers 15 annularly. The metal layer 52 is shaped to surround the diffusion layer 51 annularly. The diffusion layer 51 is, for example, an impurity semiconductor layer such as an n+ polysilicon layer, and has an impurity concentration higher than an impurity concentration of the channel semiconductor layers 15. The diffusion layer 51 is an example of a second semiconductor layer. The diffusion layer 51 and metal layer 52 function as source layers. A conductive layer (e.g., a polysilicon layer doped with an impurity, such as an N polysilicon layer doped with boron) other than a metal layer may be formed instead of the metal layer 52.

Next, a via plug 53 is formed on the metal layer 52 and a metal pad 54 is formed on the via plug 53 (FIG. 2B). The metal pad 54 is formed, for example, of Al (aluminum) or an alloy composed principally of Al. The metal pad 54 is an external connection pad of the semiconductor device of the present embodiment and is connectable to a mounted substrate or another device via a solder ball, metal bump, bonding wire, or the like. FIG. 2B further shows an insulator 55 formed covering the metal layer 52 and the like.

Subsequently, the array wafer 1 and circuit wafer 2 are diced into plural semiconductor chips. In this way, the semiconductor devices (semiconductor chips) of the present embodiment are manufactured. The plural chips diced from the array wafer 1 and circuit wafer 2, respectively, are called array chips and circuit chips, respectively.

Although the array wafer 1 is bonded to the circuit wafer 2 in the present embodiment, the array wafer 1 may be bonded to another array wafer 1 instead. The description given above with reference to FIGS. 1A to 2B and description to be given later with reference to FIGS. 3 to 24B are also applicable to bonding between array wafers 1.

Figure 3:
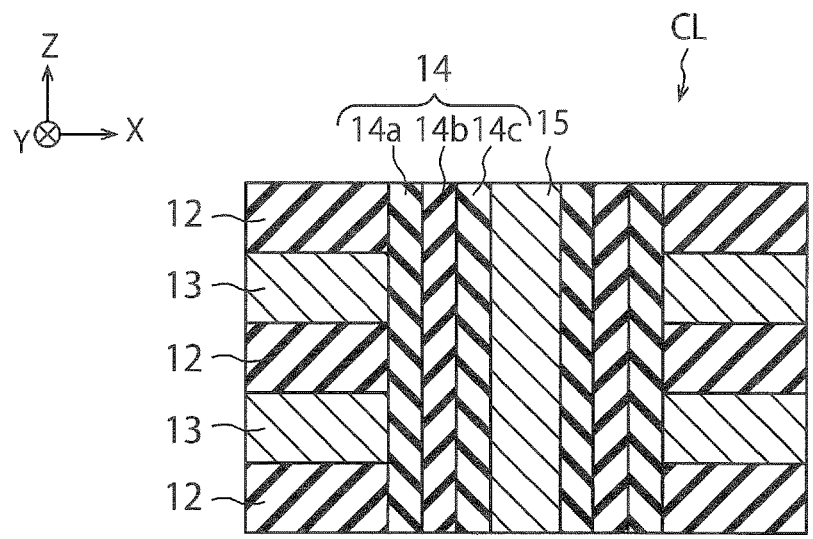
FIG. 3 is a sectional view showing a structure of a columnar portion of the first embodiment.

FIG. 3 is a sectional view showing a structure of the columnar portion CL of the first embodiment.

As shown in FIG. 3, the columnar portion CL includes the memory insulator 14 and channel semiconductor layer 15 in this order, where the memory insulator 14 includes a block insulator 14a, a charge storage layer 14b, and a tunnel insulator 14c in this order.

The charge storage layer 14b is, for example, a silicon nitride film, and is formed on side faces of the insulating layers 12 and electrode layers 13 via the block insulator 14a. The channel semiconductor layer 15 is, for example, a polysilicon layer and is formed on a side face of the charge storage layer 14b via the tunnel insulator 14c. The block insulator 14a and tunnel insulator 14c are, for example, a silicon oxide film and metal insulator, respectively. The block insulator 14a, charge storage layer 14b, tunnel insulator 14c, and channel semiconductor layer 15 are provided by extending in the Z-direction.

Figure 4:
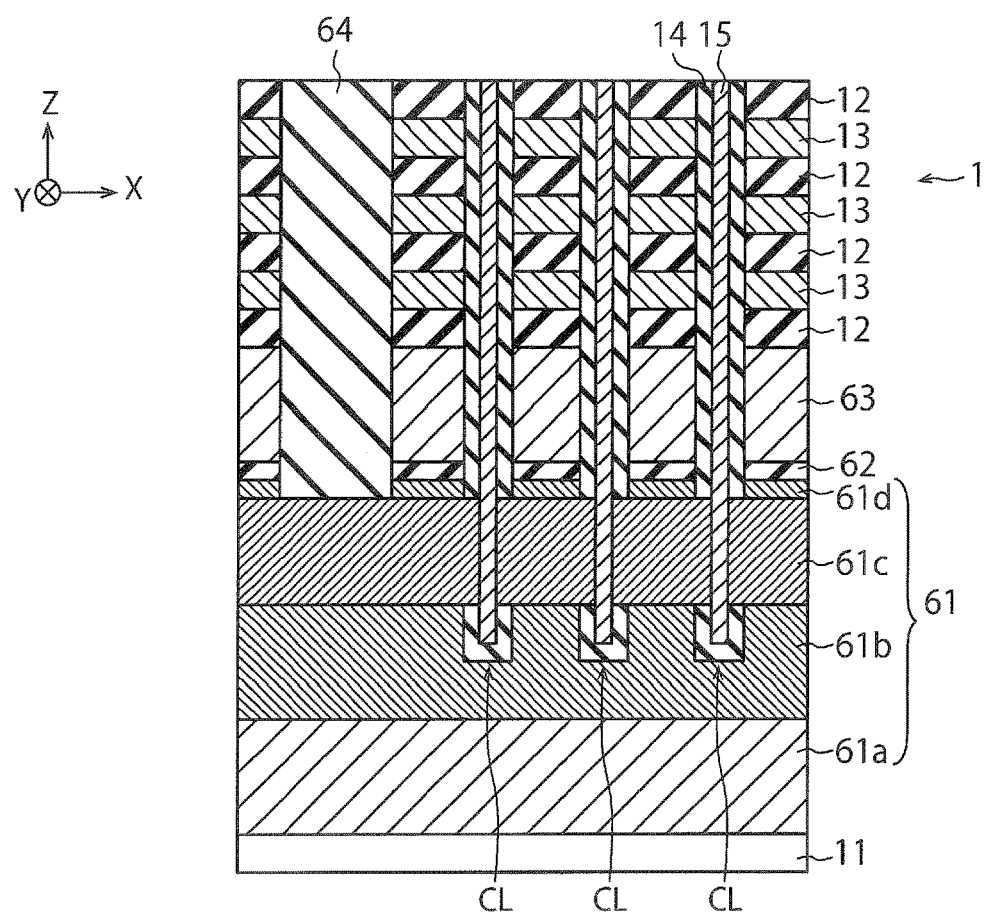
FIG. 4 is a sectional view showing a method of manufacturing a semiconductor device of a comparative example of the first embodiment.

FIG. 4 is a sectional view showing a method of manufacturing a semiconductor device of a comparative example of the first embodiment.

FIG. 4 is a sectional view corresponding to FIG. 1A and shows source layers 61, inter layer dielectric 62, and gate layer 63 provided in sequence between the substrate 11 and the lowermost insulating layer 12. The source layers 61 include a metal layer 61a, a lower semiconductor layer 61b, an intermediate semiconductor layer 61c, and an upper semiconductor layer 61d provided in sequence on the substrate 11. It should be noted that the intermediate semiconductor layer 61c is placed in contact with side faces of the channel semiconductor layers 15. The lower semiconductor layer 61b, intermediate semiconductor layer 61c, and upper semiconductor layer 61d are, for example, n-type polysilicon layers.

The above-mentioned layers are formed in sequence on the substrate 11 except the intermediate semiconductor layer 61c. On the other hand, the intermediate semiconductor layer 61c is formed by a replacement process such as described below. First, the metal layer 61a, the lower semiconductor layer 61b, a sacrificial layer, and the upper semiconductor layer 61d are formed in sequence on the substrate 11. Next, a trench to be embedded later with an isolation insulator 64 is formed, the sacrificial layer is replaced with the intermediate semiconductor layer 61c using the trench, and then the isolation insulator 64 is embedded in the trench. When the sacrificial layer is removed, the memory insulator 14 on a side face of the sacrificial layer is removed as well. As a result, the intermediate semiconductor layer 61c is formed in contact with the side faces of the channel semiconductor layers 15.

In manufacturing the semiconductor device of the comparative example, the following problems arise, for example. (1) It is difficult to form memory holes by penetrating the metal layer 61a, lower semiconductor layer 61b, sacrificial layer, and upper semiconductor layer 61d. (2) It is difficult to appropriately perform a replacement process using the trench. (3) In the replacement process, it is difficult to remove the memory insulators 14 while leaving the channel semiconductor layers 15. In addition, (4) in the replacement process, it is difficult to form the intermediate semiconductor layer 61c in a cavity between the lower semiconductor layer 61b and upper semiconductor layer 61d by epitaxial growth. In this way, with the comparative example, various problems are likely to occur in relation to formation of a structure for connection with the source layers 61.

In contrast, the source layers (diffusion layer 51 and metal layer 52) of the present embodiment are formed after the array wafer 1 is bonded to the circuit wafer 2. Specifically, after the array wafer 1 is bonded to the circuit wafer 2, the channel semiconductor layers 15 are exposed by removing the substrate 11 and the source layers are formed on the surfaces of the channel semiconductor layers 15. Therefore, the present embodiment makes it possible to form memory holes more easily than the comparative example and form source layers without performing the replacement process like the comparative example.

As described above, according to the present embodiment, the array wafer 1 is bonded on the circuit wafer 2, the substrate 11 is removed from the array wafer 1, and the diffusion layer 51 is formed on the surfaces of the channel semiconductor layers 15. Therefore, the present embodiment makes it possible to connect the diffusion layer 51 appropriately to the channel semiconductor layers 15. For example, the present embodiment makes it possible to connect the diffusion layer 51 to the channel semiconductor layers 15 in a simple manner without causing the various problems of the comparative example.

Second Embodiment

FIGS. 5A to 6B are sectional views showing a method of manufacturing a semiconductor device of a second embodiment.

Figure 5A:
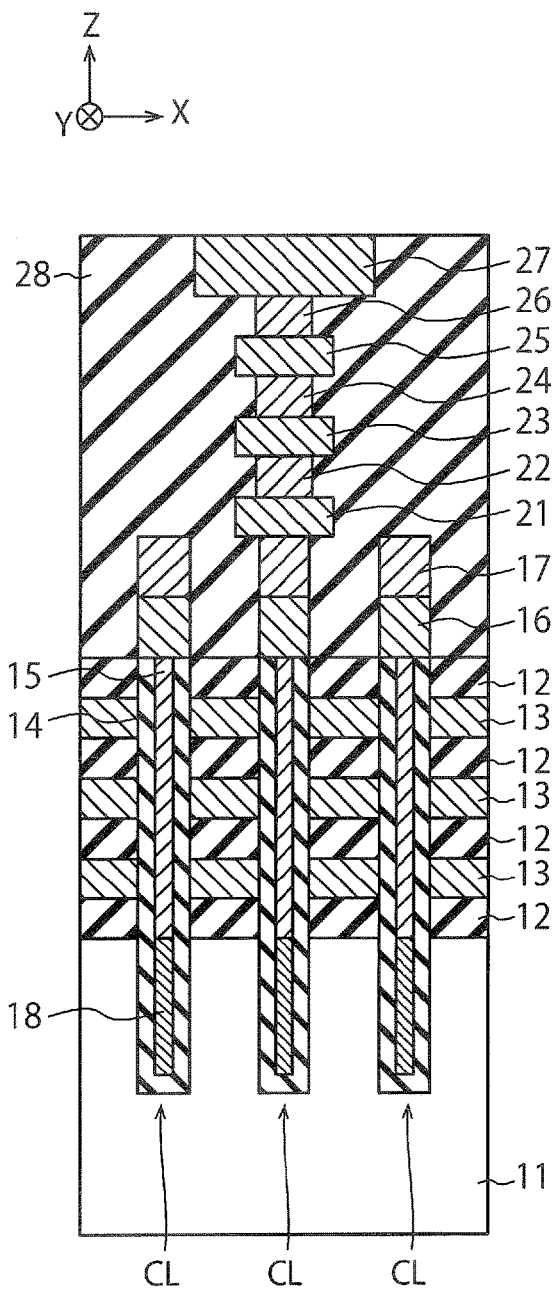
FIGS. 5A to 6B are sectional views showing a method of manufacturing a semiconductor device of a second embodiment.

First, an array wafer 1 shown in FIG. 5A is prepared. Each columnar portion CL of the present embodiment includes a diffusion layer 18 in addition to the memory insulator 14 and channel semiconductor layer 15. The diffusion layer 18 is, for example, an impurity semiconductor layer such as an n+ polysilicon layer. The diffusion layer 18 is an example of the second semiconductor layer.

The memory insulator 14 and channel semiconductor layer 15 have a columnar shape extending in the Z direction as with the first embodiment. Similarly, the diffusion layer 18 has a columnar shape extending in the Z direction. Specifically, the diffusion layer 18 is shaped to extend in the −Z direction from a bottom of the channel semiconductor layer 15 and is electrically connected to the channel semiconductor layer 15. It should be noted that since the diffusion layer 18 is provided at the bottom of the channel semiconductor layer 15 in the present embodiment, the bottom of the channel semiconductor layer 15 of the present embodiment differs in position from the bottom of the channel semiconductor layer 15 of the first embodiment. The memory insulator 14 is formed around the channel semiconductor layer 15 and diffusion layer 18 in such a way as to have a tubular shape. The columnar portions CL are configured by forming respective memory holes that penetrate the insulating layers 12 and electrode layers 13, forming the memory insulators 14 in the memory holes, and further forming the diffusion layers 18 and channel semiconductor layers 15 in the memory holes.

Figure 5B:
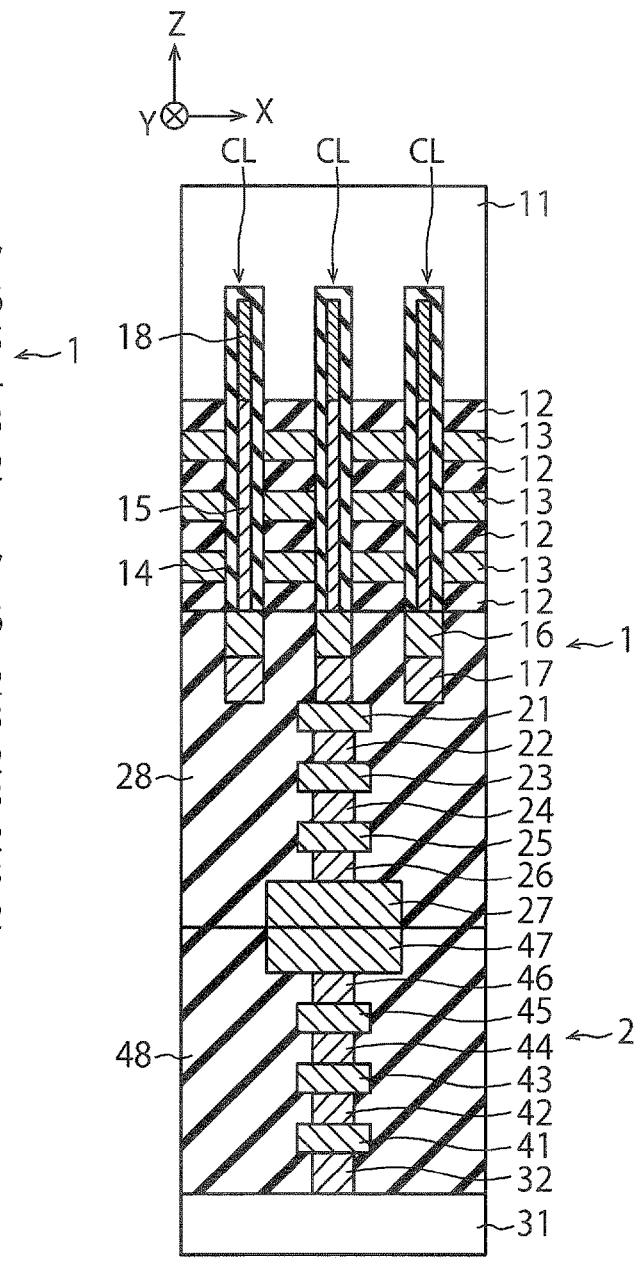

Next, the circuit wafer 2 shown in FIG. 5B is prepared and the array wafer 1 is bonded to the circuit wafer 2. The circuit wafer 2 of the present embodiment is similar in structure to the circuit wafer 2 of the first embodiment.

It should be noted that the array wafer 1 of FIG. 5B is opposite in orientation to the array wafer 1 of FIG. 5A. This is similar to a relationship between the array wafer 1 of FIG. 1A and the array wafer 1 of FIG. 1B. As a result, in FIG. 5B, the above-mentioned bottom of the channel semiconductor layer 15 corresponds to an upper portion, rather than a lower portion, of the channel semiconductor layer 15. Therefore, the diffusion layers 18 of FIG. 5B are shaped to extend in the +Z direction from the upper portion of the channel semiconductor layer 15.

Figure 6A:
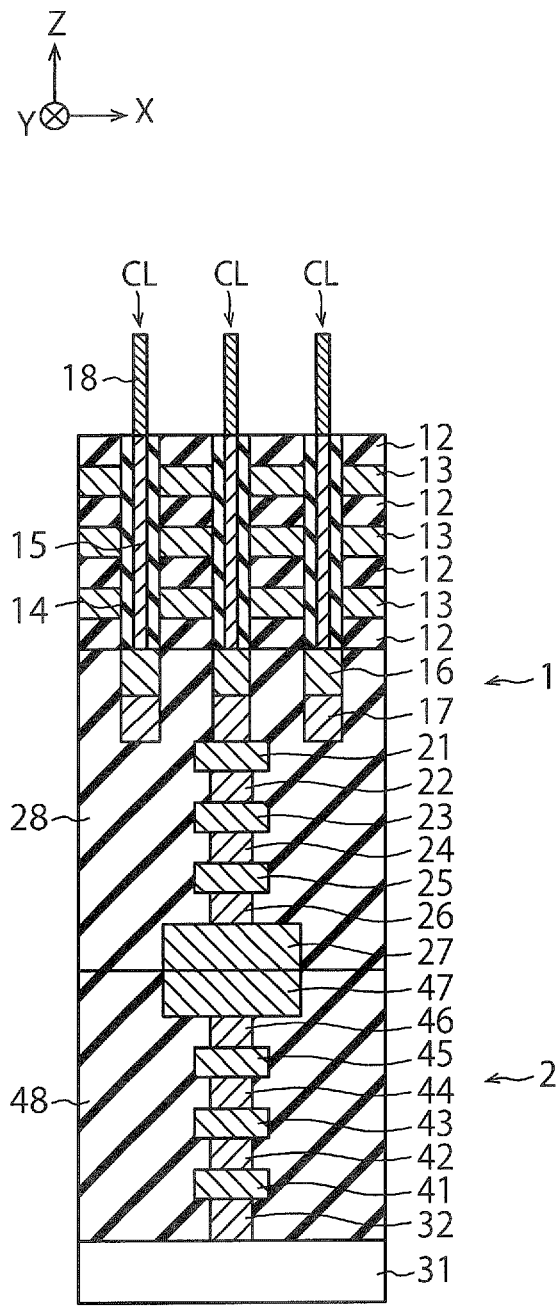

Next, the substrate 11 is removed from the array wafer 1 (FIG. 6A). In so doing, the memory insulators 14 located at a position higher than the upper surface of the uppermost insulating layer 12 is also removed. As a result, the diffusion layers 18 are exposed.

Figure 6B:
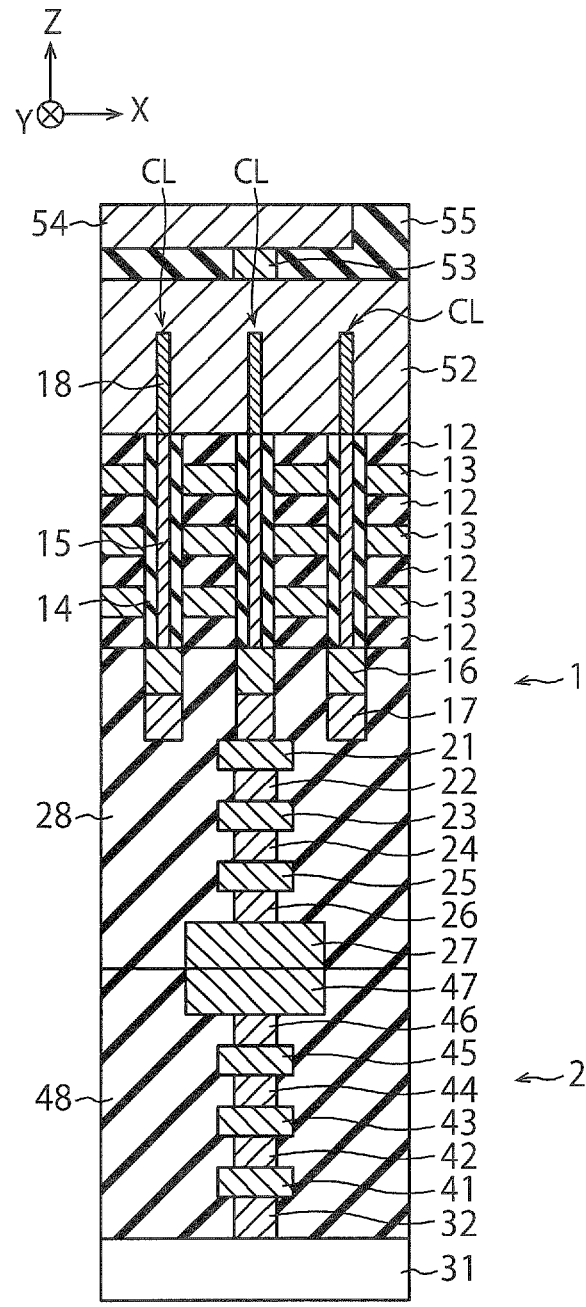

Next, the metal layer 52 is formed on the entire surface of the substrate 31 (FIG. 6B). As a result, the metal layer 52 is formed on surfaces of the diffusion layers 18 and on the upper surface of the uppermost insulating layer 12 and is electrically connected to the diffusion layers 18. The diffusion layers 18 and metal layer 52 function as source layers.

Next, a via plug 53 is formed on the metal layer 52 and a metal pad 54 is formed on the via plug 53 (FIG. 6B). FIG. 6B further shows an insulator 55 formed covering the metal layer 52 and the like.

Subsequently, the array wafer 1 and circuit wafer 2 are diced into plural semiconductor chips. In this way, the semiconductor devices (semiconductor chips) of the present embodiment are manufactured.

Now, the first and second embodiments will be compared.

According to the first embodiment, the diffusion layer 51 is formed after the array wafer 1 is bonded to the circuit wafer 2. The diffusion layer 51 is formed, for example, by doping an amorphous silicon layer with impurities and then annealing and crystalizing the amorphous silicon layer. In this case, depending on conditions of the annealing, heat of the annealing might adversely affect joint portions between the metal pads 27 and 47.

On the other hand, according to the second embodiment, the diffusion layers 18 are formed before the array wafer 1 is bonded to the circuit wafer 2. The diffusion layers 18 are formed, for example, by a method similar to that of the diffusion layer 51. Therefore, since the joint portions between the metal pads 27 and 47 do not exist yet at the time of annealing, the problems of concern in the first embodiment described above can be avoided. Also, unlike the intermediate semiconductor layer 61c of the comparative example shown in FIG. 4, the diffusion layers 18 of the present embodiment can be formed without using a replacement process in which a sacrificial layer is formed so the present embodiment is free of the problems encountered in the comparative example described above.

The first embodiment has an advantage over the second embodiment, for example, in that the process of embedding various layers in the memory holes can be performed in a simple manner.

As described above, according to the present embodiment, the array wafer 1 is bonded on the circuit wafer 2 after the diffusion layers 18 located under the channel semiconductor layers 15 are formed. Therefore, the present embodiment makes it possible to connect the diffusion layers 18 appropriately to the channel semiconductor layers 15 as with the first embodiment. For example, the present embodiment makes it possible to connect the diffusion layers 18 to the channel semiconductor layers 15 in a simple manner while curbing the various problems of the comparative example.

Third Embodiment

FIGS. 7 to 17 are sectional views showing a method of manufacturing a semiconductor device of a third embodiment. The semiconductor device of the present embodiment is an example of the semiconductor device of the second embodiment.

Figure 7:
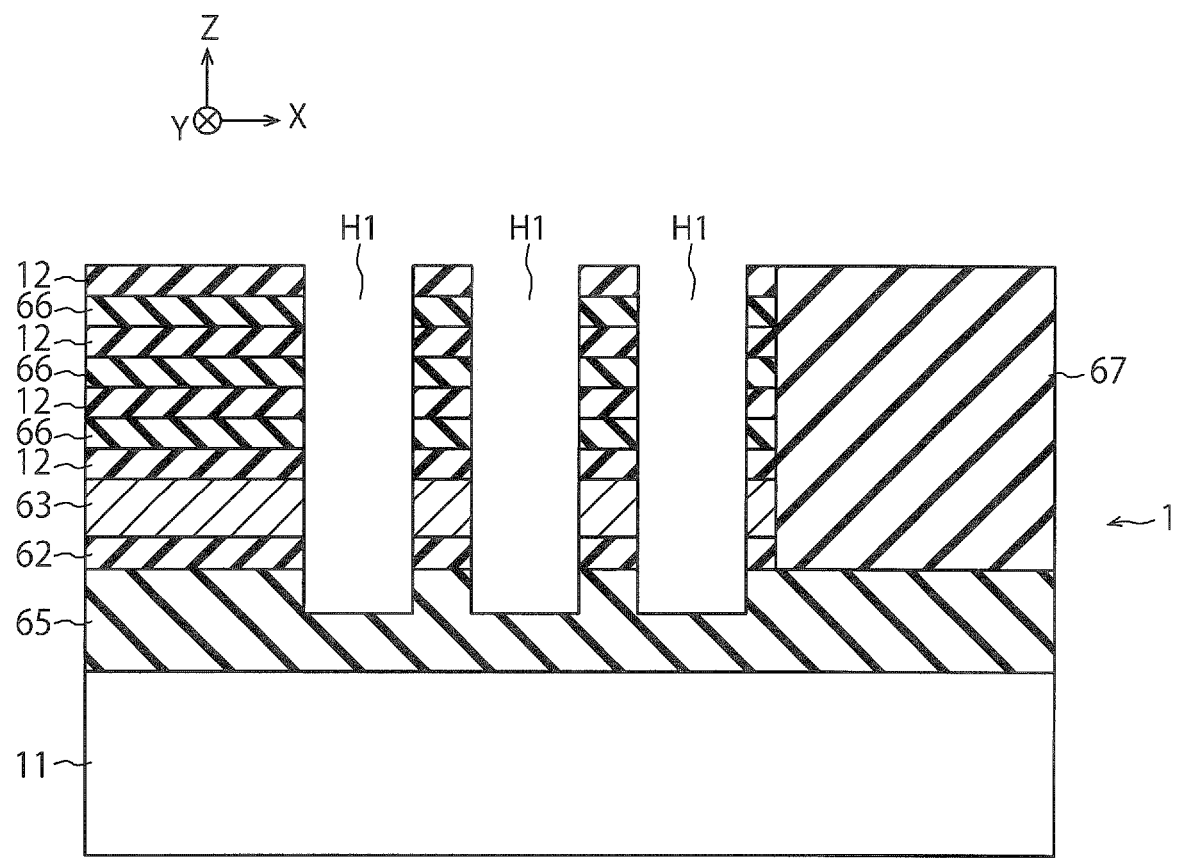
FIGS. 7 to 17 are sectional views showing a method of manufacturing a semiconductor device of a third embodiment.

First, an underlying insulator 65, inter layer dielectric 62, and gate layer 63 are formed in sequence on the substrate 11 of the array wafer 1, and plural insulating layers 12 and plural sacrificial layers 66 are formed alternately on the gate layer 63 (FIG. 7). The underlying insulator 65 is, for example, a silicon nitride film, the inter layer dielectric 62 is, for example, a silicon oxide film, and the gate layer 63 is, for example, an n+ polysilicon layer. The insulating layers 12 are, for example, silicon oxide films and sacrificial layers 66 are, for example, silicon nitride films. Next, plural memory holes H1 and an embedded insulator 67 are formed penetrating the insulating layers 12, sacrificial layers 66, gate layer 63, and inter layer dielectric 62 (FIG. 7). The embedded insulator 67 is, for example, a silicon oxide film.

Figure 8:
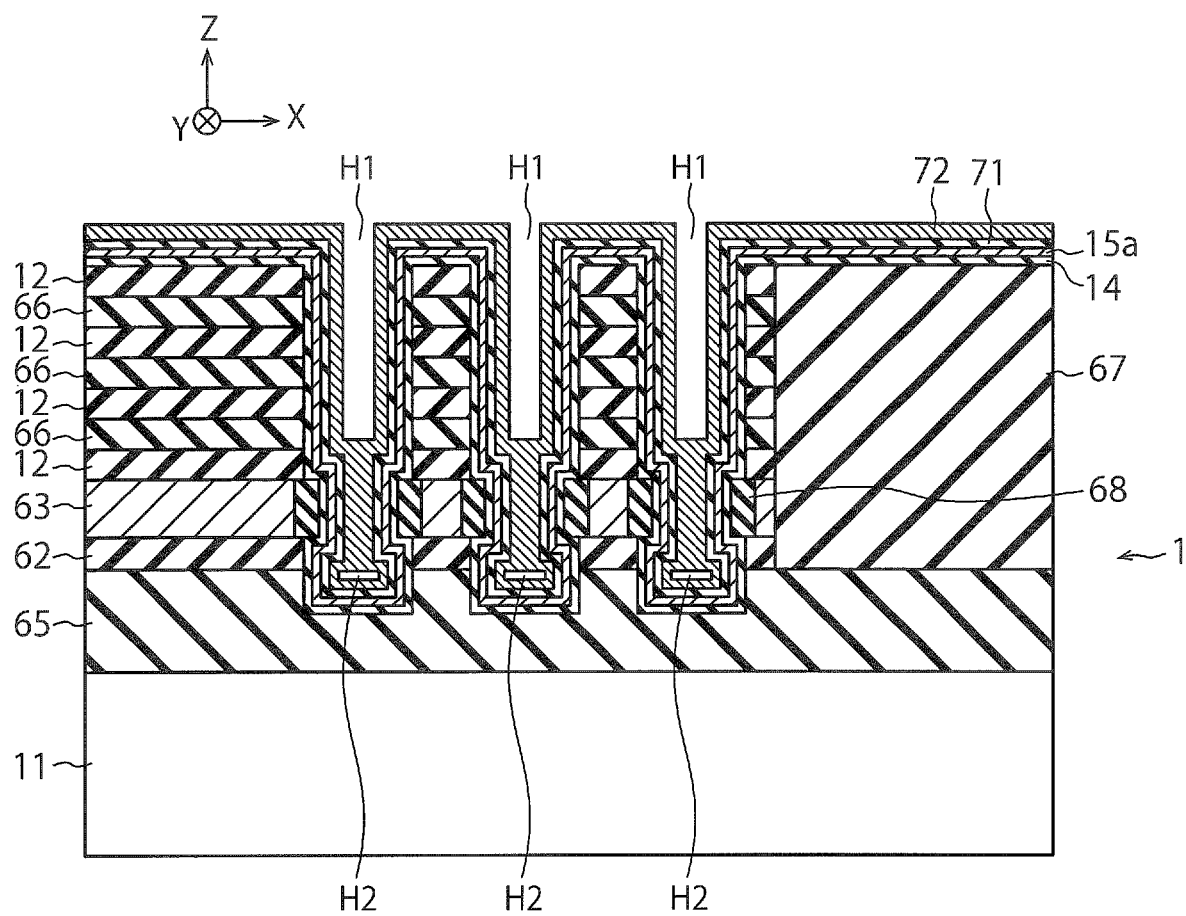

Next, side faces of the gate layer 63 in the memory holes H1 are oxidized (FIG. 8). As a result, an oxide film 68 (e.g., silicon oxide film) having an annular shape is formed around the side face of the gate layer 63 in each memory hole H1. It should be noted that this reduces a diameter of each memory hole H1 at the location of the oxide film 68. The oxide film 68 is an example of a second insulator.

Next, a memory insulator 14, first body layer 15a, diffusion barrier layer 71, and diffusion layer 72 are formed in sequence on side faces and bottom surfaces of the memory holes H1 (FIG. 8). The first body layer 15a, which becomes a portion of a channel semiconductor layer 15, is formed, for example, as an amorphous silicon layer and is turned into a polysilicon layer by subsequent annealing. The diffusion barrier layer 71 is intended to prevent diffusion of impurities from the diffusion layer 72 into the first body layer 15a and the like and is, for example, a silicon oxide film. The diffusion layer 72 is formed, for example, as an n-type amorphous silicon layer and is turned into an n-type polysilicon layer by subsequent annealing. The diffusion layer 72 functions as a portion of a source layer.

The diffusion layer 72 of the present embodiment is formed to such a thickness as to block up the memory holes H1 at the height of the oxide film 68. It should be noted that the memory holes H1 are not blocked up above the oxide film 68 in FIG. 8. In each memory hole H1, a cavity H2 is left in the diffusion layer 72 below the oxide film 68, but such a cavity H2 does not need to be left. According to the present embodiment, the diffusion layer 72 and first body layer 15a are surrounded by an oxide film 68 of an annular shape.

Although in the present embodiment, the diameter of each memory hole H1 is reduced by the oxide film 68, the diameter may be reduced by another method. For example, the diameter of each memory hole H1 may be reduced by tapering the side face of the gate layer 63 in each memory hole H1.

Figure 9:
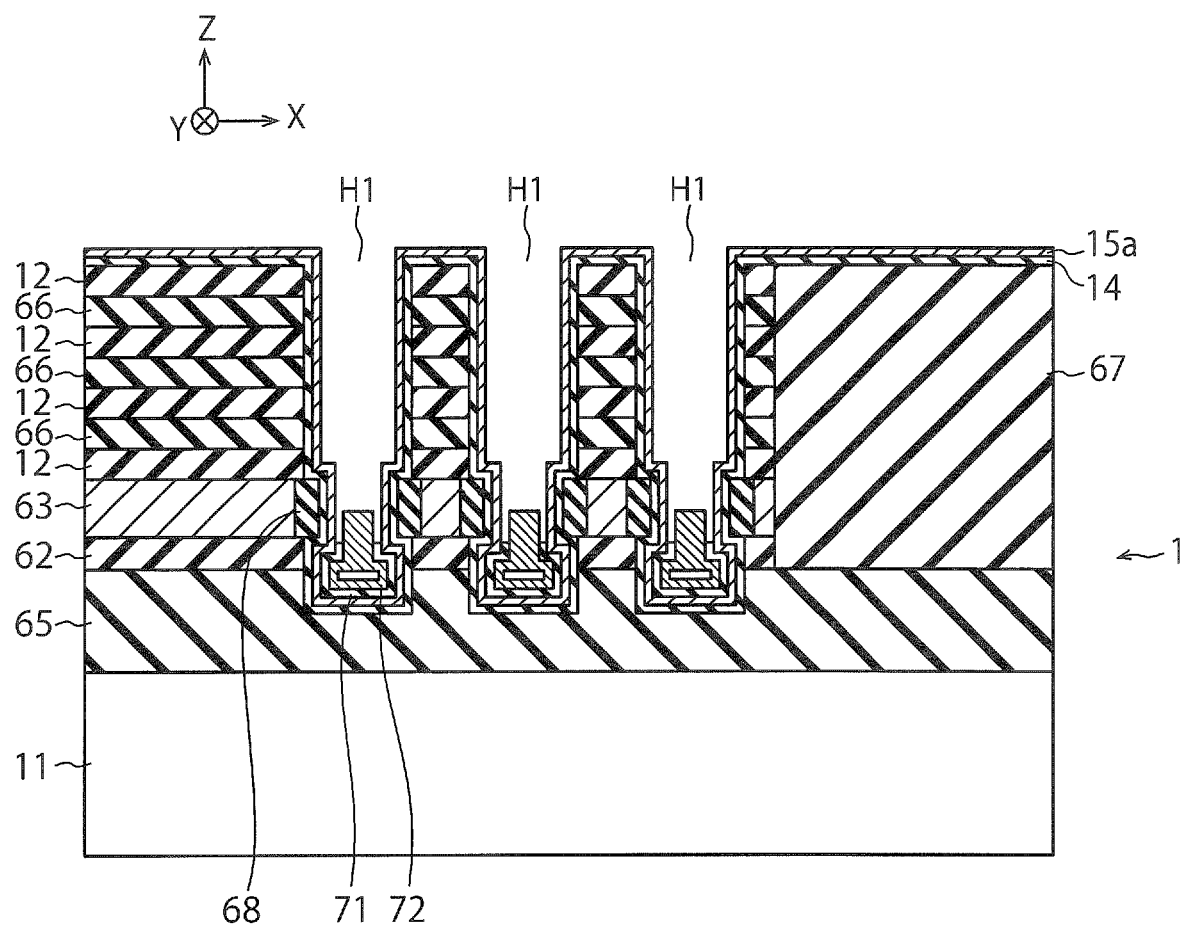

Next, the diffusion layer 72 above the oxide film 68 is removed by slimming and the diffusion barrier layer 71 above the oxide film 68 is removed by etching (FIG. 9).

Figure 10:
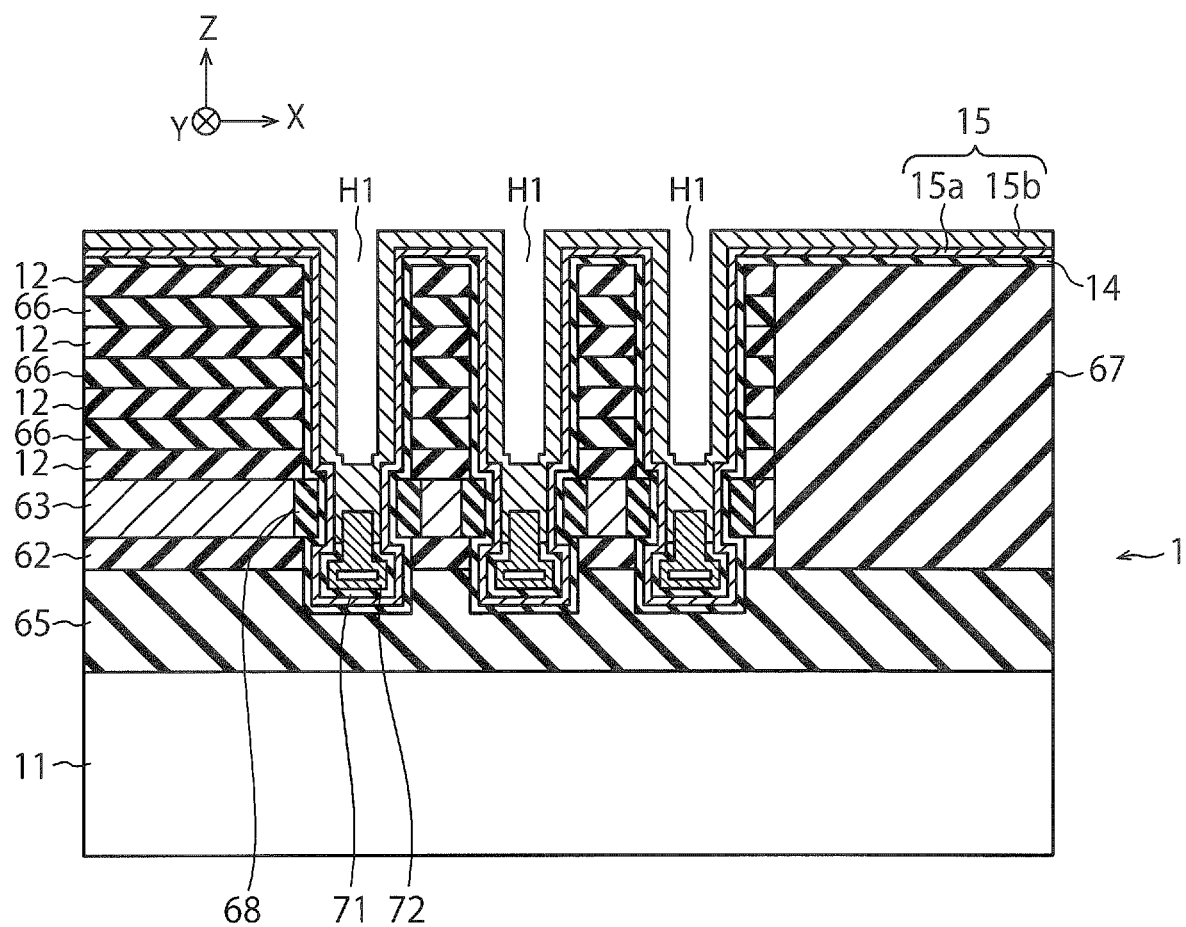

Next, a second body layer 15b is formed on side faces and bottom surfaces of the memory holes H1 (FIG. 10). The second body layer 15b, which becomes a portion of a channel semiconductor layer 15 together with the first body layer 15a, is formed, for example, as an amorphous silicon layer and is turned into a polysilicon layer by subsequent annealing. The second body layer 15b is formed in contact with the first body layer 15a and diffusion layer 72. Hereinafter, the first and second body layers 15a and 15b will be collectively referred to as the channel semiconductor layer 15.

Figure 11:
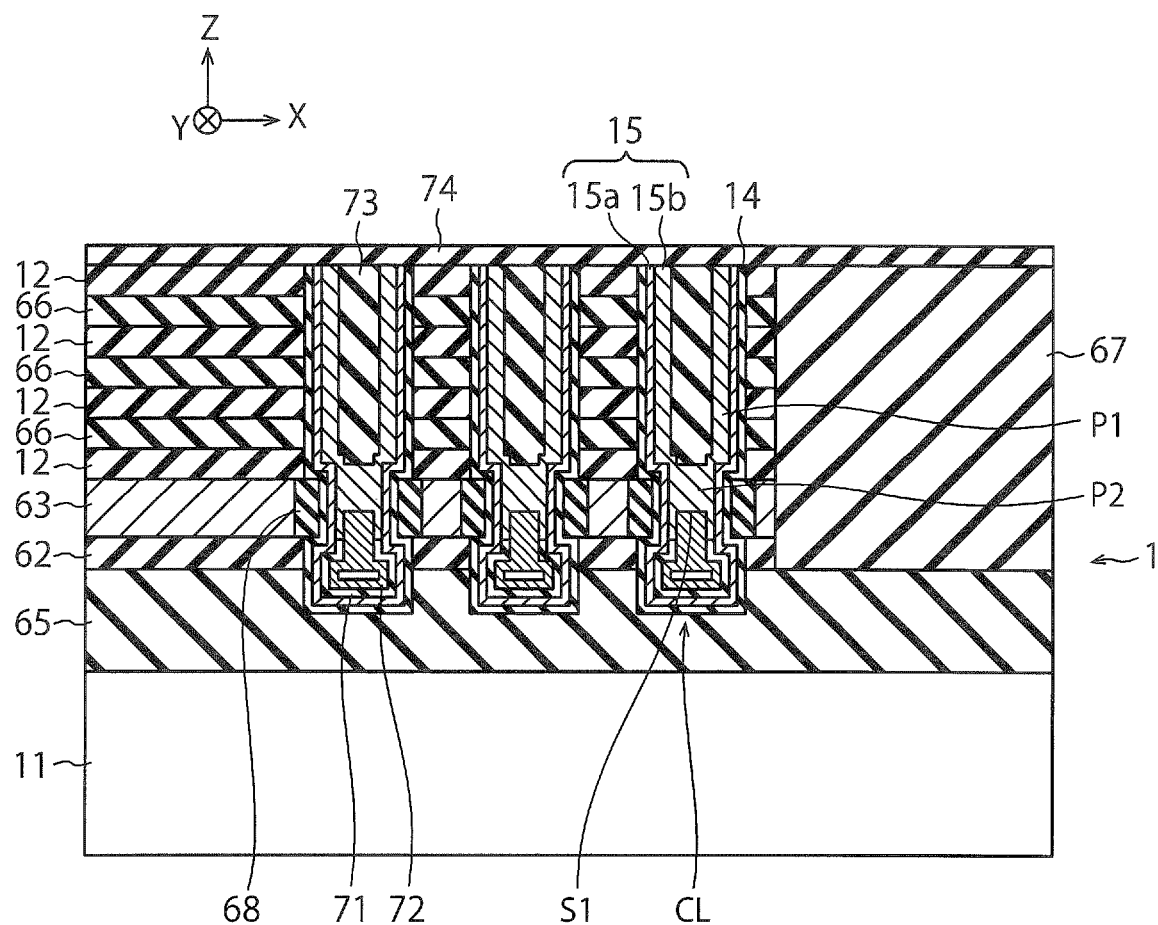

Next, a core insulator 73 is formed in each memory hole H1 (FIG. 11). The core insulator 73 is, for example, a silicon oxide film. It should be noted that the core insulator 73 of the present embodiment is formed above the oxide film 68 rather than inside the ring of the oxide film 68. The core insulator 73 is an example of a first insulator. Next, those portions of the memory insulator 14, channel semiconductor layer 15, and core insulator 73 which are outside the memory holes H1 are removed and then a cover insulator 74 is formed on the entire surface of the substrate 11 (FIG. 11). The cover insulator 74 is, for example, a silicon oxide film.

FIG. 11 shows a first portion P1 and a second portion P2 of the channel semiconductor layer 15. The first portion P1 is located above the oxide film 68 by being provided around a side face of the core insulator 73. The second portion P2 is located inside the ring of the oxide film 68 by being provided below the first portion P1 and core insulator 73. The diffusion layer 72 is provided under the second portion P2. After the array wafer 1 is bonded to the circuit wafer 2, the first portion P1 and core insulator 73 will be located under the second portion P2 and the second portion P2 will be located under the diffusion layer 72.

Figure 12:
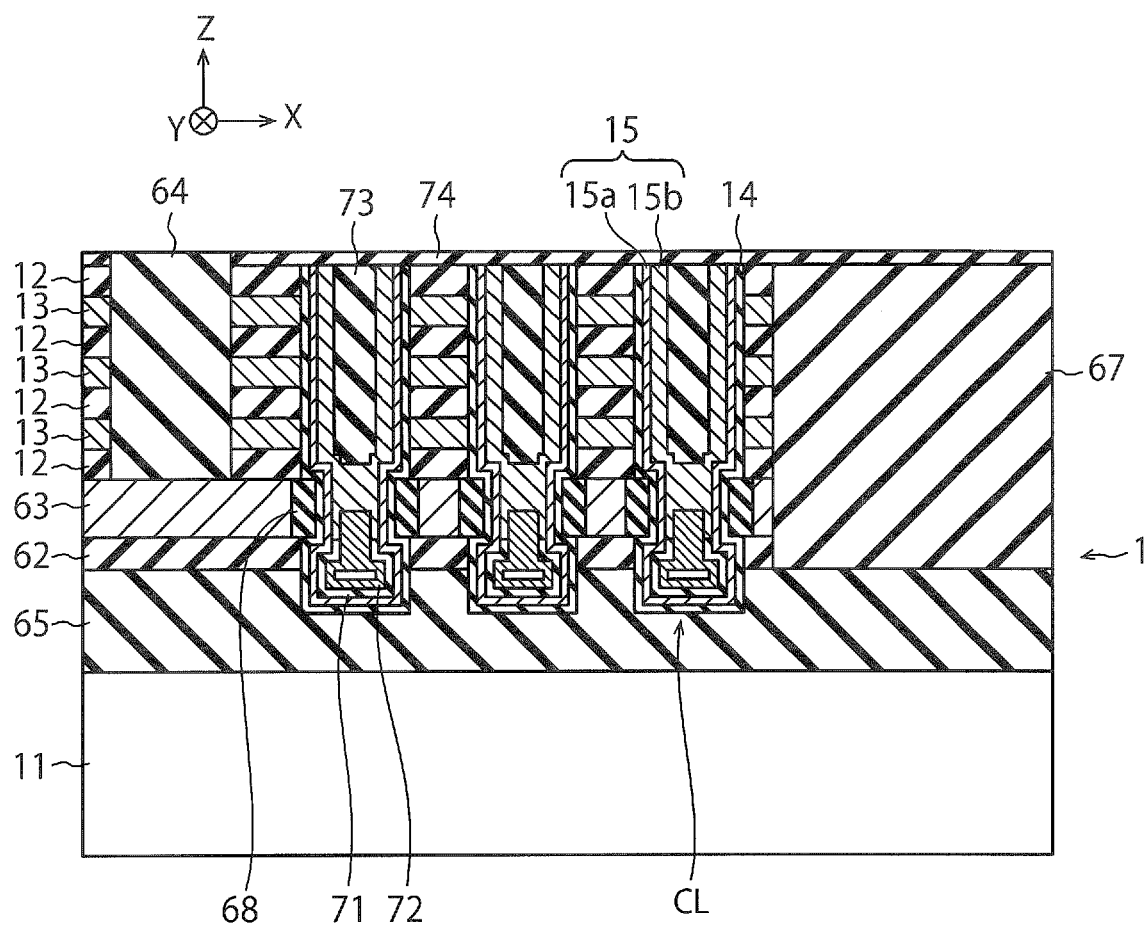

Next, a trench is formed in the cover insulator 74, insulating layers 12, and sacrificial layers 66, the sacrificial layers 66 are replaced with electrode layers 13 using the trench, and then an isolation insulator 64 is embedded in the trench (FIG. 12). The isolation insulator 64 is, for example, a silicon oxide film.

Figure 13:
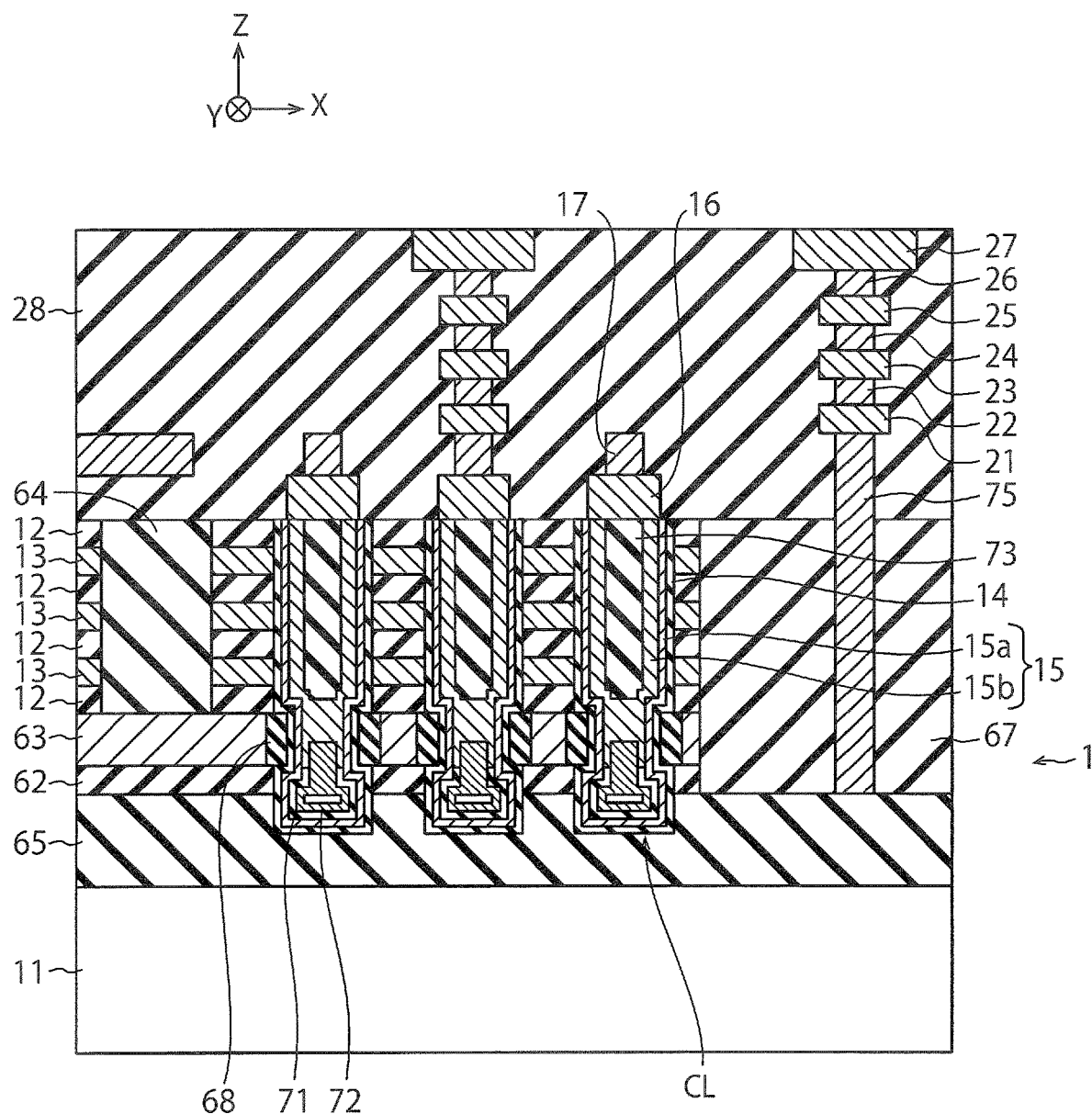

Next, the cover insulator 74 is removed and contact plugs 16, via plugs 17, interconnection layers 21, a via plug 22, interconnection layers 23, via plugs 24, interconnection layers 25, via plugs 26, metal pads 27, an inter layer dielectric 28, and a via plug 75 are formed on the substrate 11 (FIG. 13). The via plug 75 is formed under the interconnection layer 21 in the embedded insulator 67 and inter layer dielectric 28.

Figure 14:
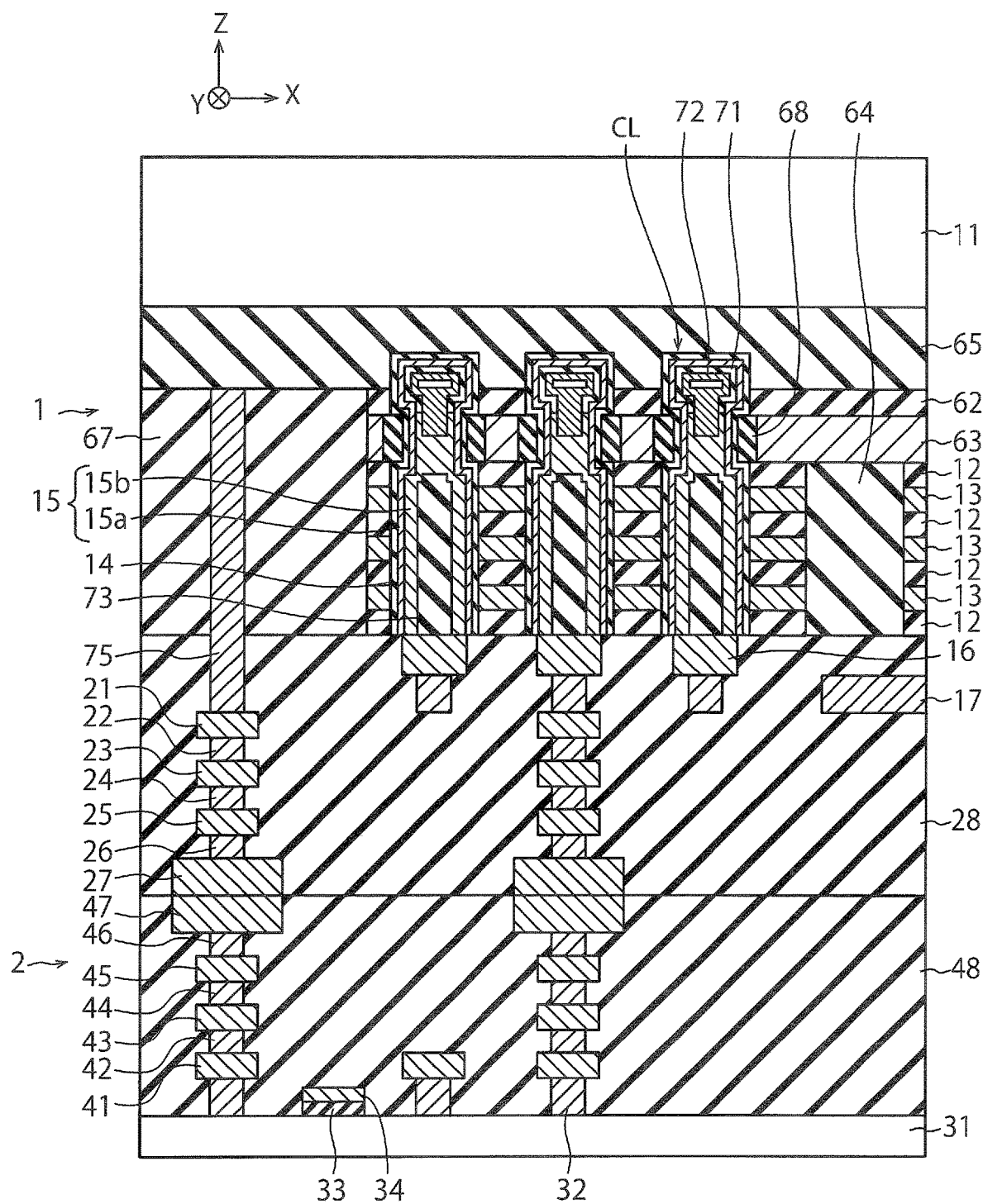

Next, the circuit wafer 2 shown in FIG. 14 is prepared and the array wafer 1 is bonded to the circuit wafer 2. The circuit wafer 2 of the present embodiment is similar in structure to the circuit wafers 2 of the first and second embodiments. However, FIG. 14 further shows a gate insulator 33 and gate electrode 34 of a MOS transistor making up a logic circuit. The gate insulator 33 and gate electrode 34 are formed in sequence on the substrate 31.

Figure 15:
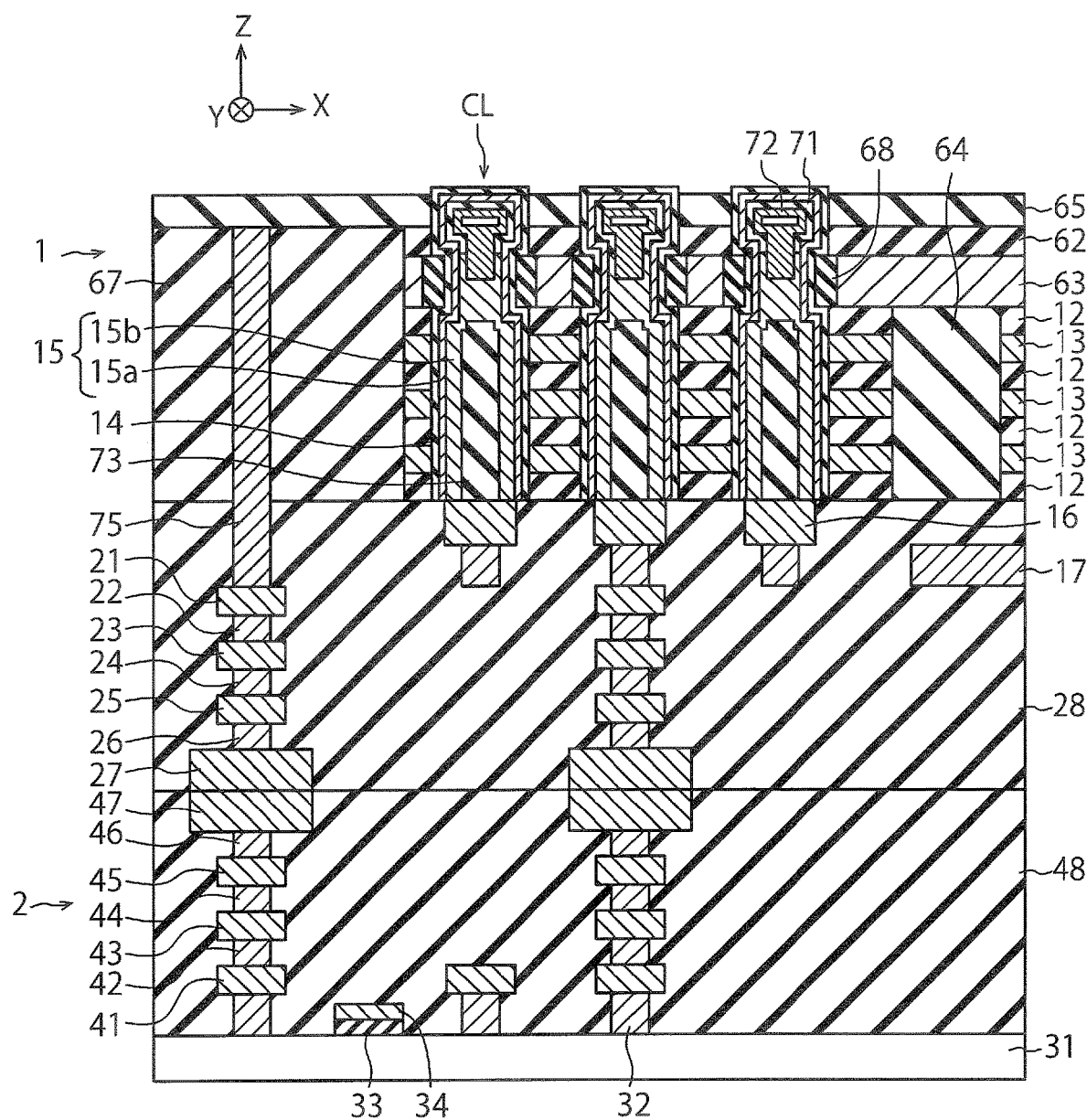

Next, the substrate 11 is removed by CMP, and the underlying insulator 65 is thinned by etchback (FIG. 15). As a result, the memory insulator 14 of each columnar portion CL is exposed.

Figure 16:
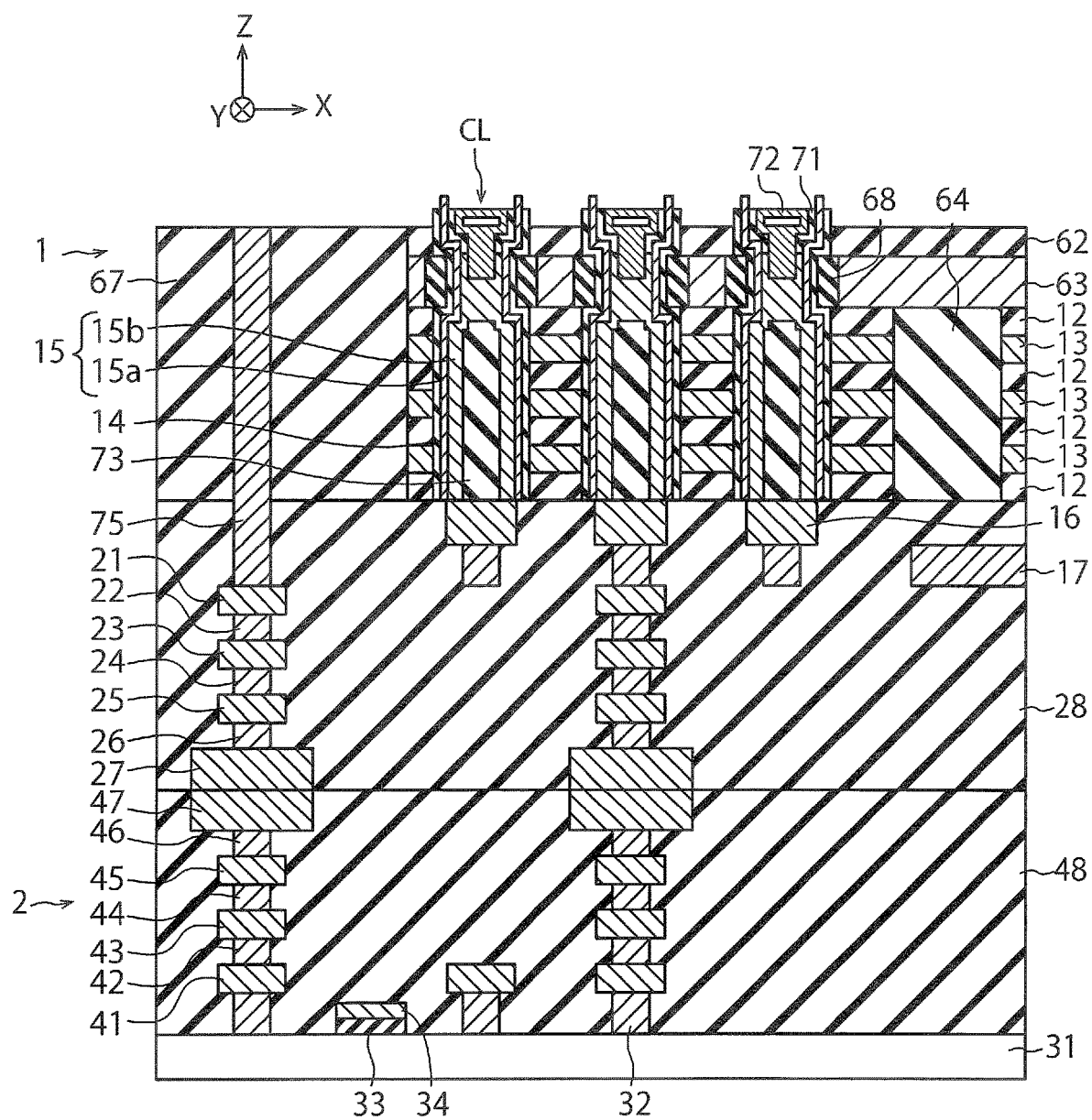

Next, the underlying insulator 65 is removed by etchback and at the same time, a portion of the memory insulator 14, first body layer 15a, and diffusion barrier layer 71 of each columnar portion CL is removed by etchback (FIG. 16). As a result, diffusion layer 72 of each columnar portion CL is exposed. Furthermore, the via plug 75 is exposed.

Figure 17:
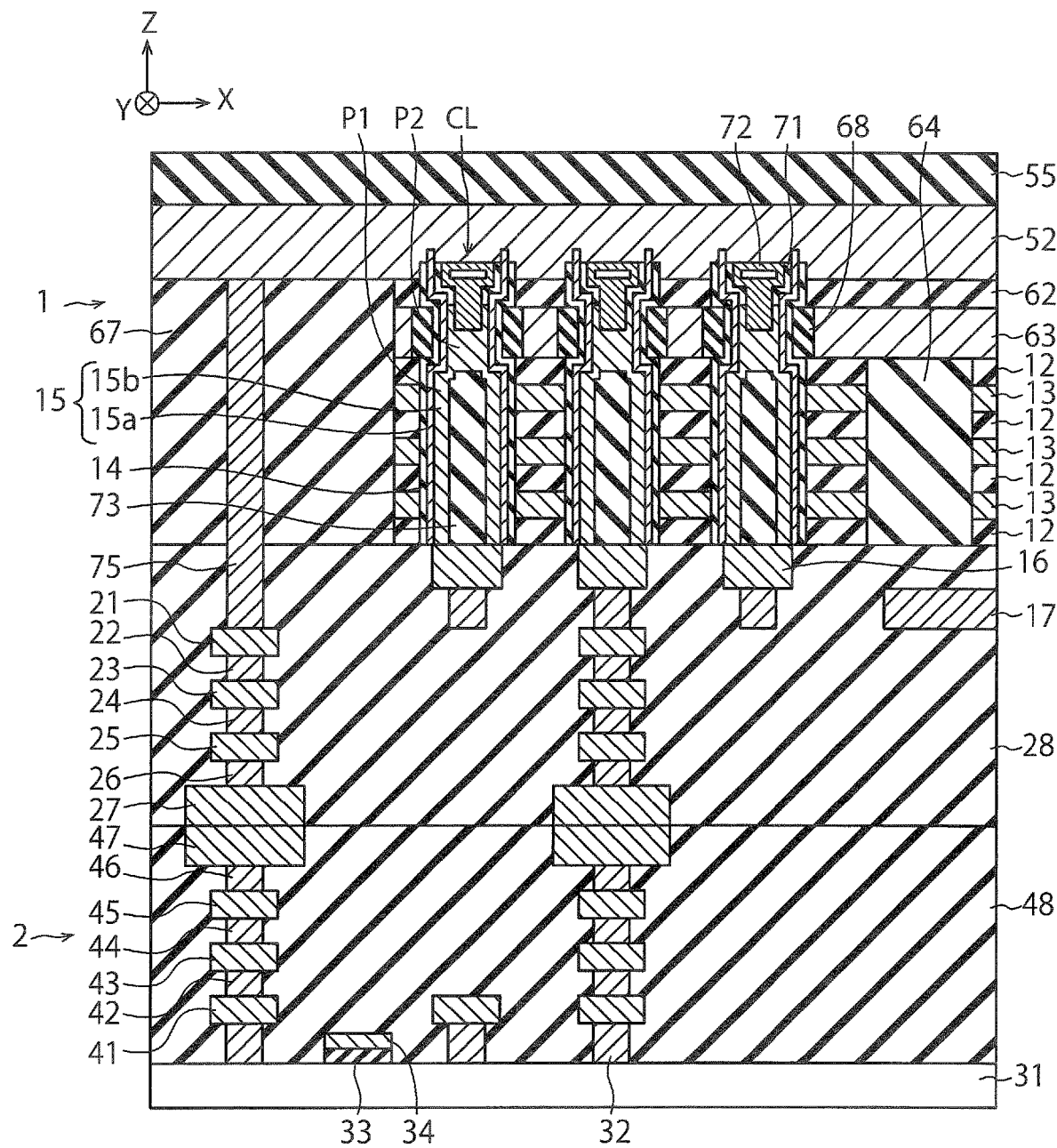

Next, a metal layer 52 and insulator 55 are formed in sequence on the entire surface of the substrate 31 (FIG. 17). As a result, the metal layer 52 is formed on the diffusion layer 72 of each columnar portion CL and the diffusion layer 72 and metal layer 52 are electrically interconnected. The diffusion layer 72 and metal layer 52 function as source layers. The metal layer 52 is also formed on the via plug 75.

FIG. 17 shows the first portion P1 and the second portion P2 of the channel semiconductor layer 15. The first portion P1 is provided around the side face of the core insulator 73 and the second portion P2 is provided on the first portion P1 and the core insulator 73. The diffusion layer 72 is provided on the second portion P2 of the channel semiconductor layer 15.

Subsequently, the array wafer 1 and circuit wafer 2 are diced into plural semiconductor chips. In this way, the semiconductor devices (semiconductor chips) of the present embodiment are manufactured.

The present embodiment allows the diffusion layer 18 of the second embodiment to be implemented in the form of the diffusion layer 72. Therefore, the present embodiment makes it possible to connect the diffusion layers 72 appropriately to the channel semiconductor layers 15 as with the first and second embodiments.

Fourth Embodiment

FIGS. 18A to 22B are sectional views showing a method of manufacturing a semiconductor device of a fourth embodiment. The present embodiment is a variation of the third embodiment. Whereas the diffusion layer 72 of the third embodiment is formed in a columnar shape, a diffusion layer 72 of the present embodiment is formed in an annular shape.

Figure 18B:
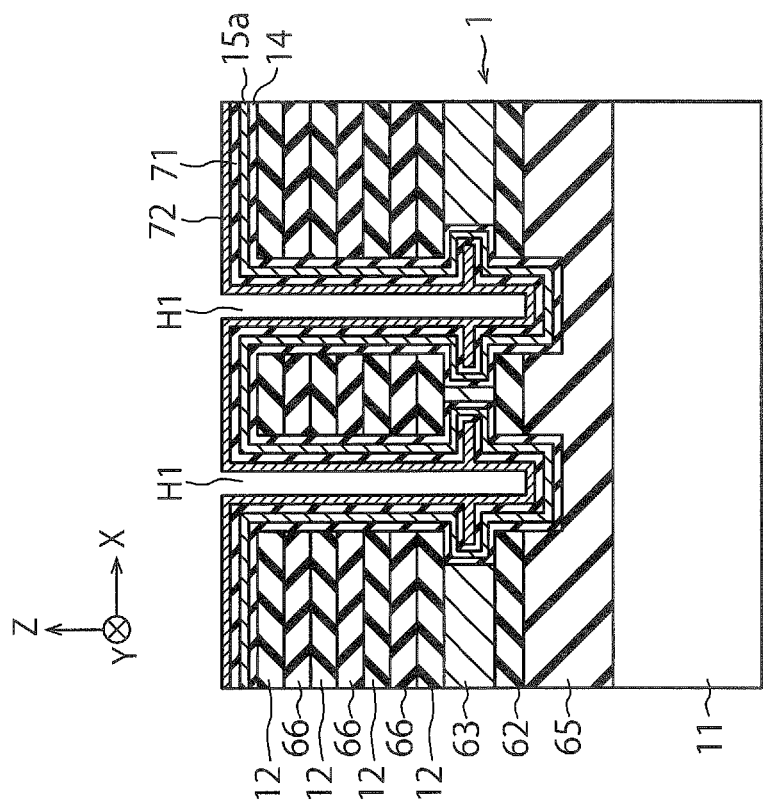
Figure 18A:
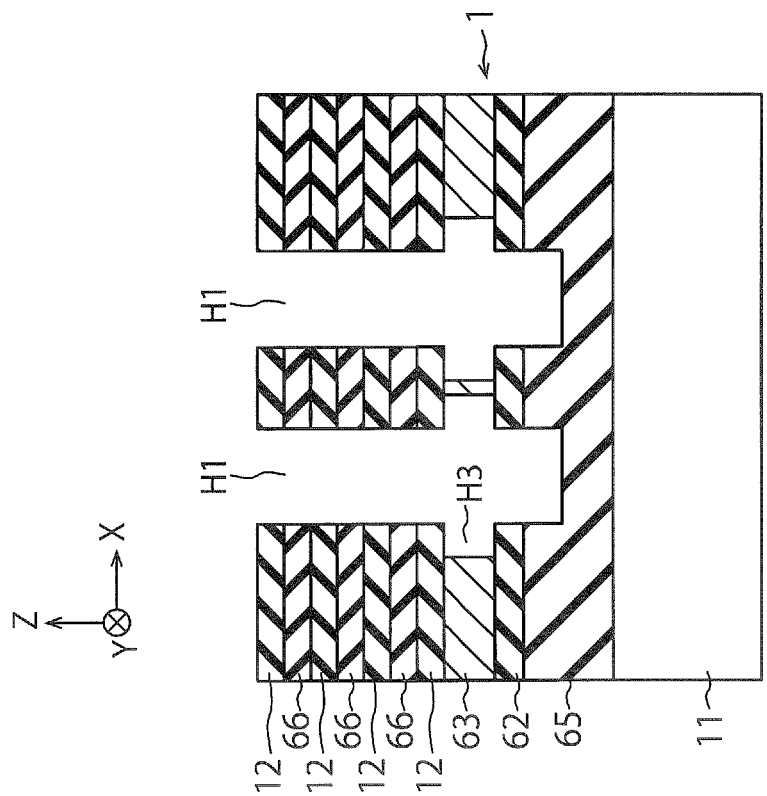

First, an underlying insulator 65, inter layer dielectric 62, and gate layer 63 are formed in sequence on the substrate 11 of the array wafer 1, and plural insulating layers 12 and plural sacrificial layers 66 are formed alternately on the gate layer 63 (FIG. 18A). Next, plural memory holes H1 are formed penetrating the insulating layers 12, sacrificial layers 66, gate layer 63, and inter layer dielectric 62 (FIG. 18A). Next, the side face of the gate layer 63 in each memory hole H1 is etched (FIG. 18A). As a result, a cavity H3 having an annular shape is formed in the side face of the gate layer 63. In other words, a diameter of a space made up of the memory hole H1 and cavity H3 is increased in the gate layer 63.

Next, a memory insulator 14, first body layer 15a, diffusion barrier layer 71, and diffusion layer 72 are formed in sequence on surfaces of the memory holes H1 and cavities H3 (FIG. 18B). The diffusion layer 72 of the present embodiment is formed to such a thickness as to block up the cavities H3 without blocking up the memory holes H1.

Figure 19B:
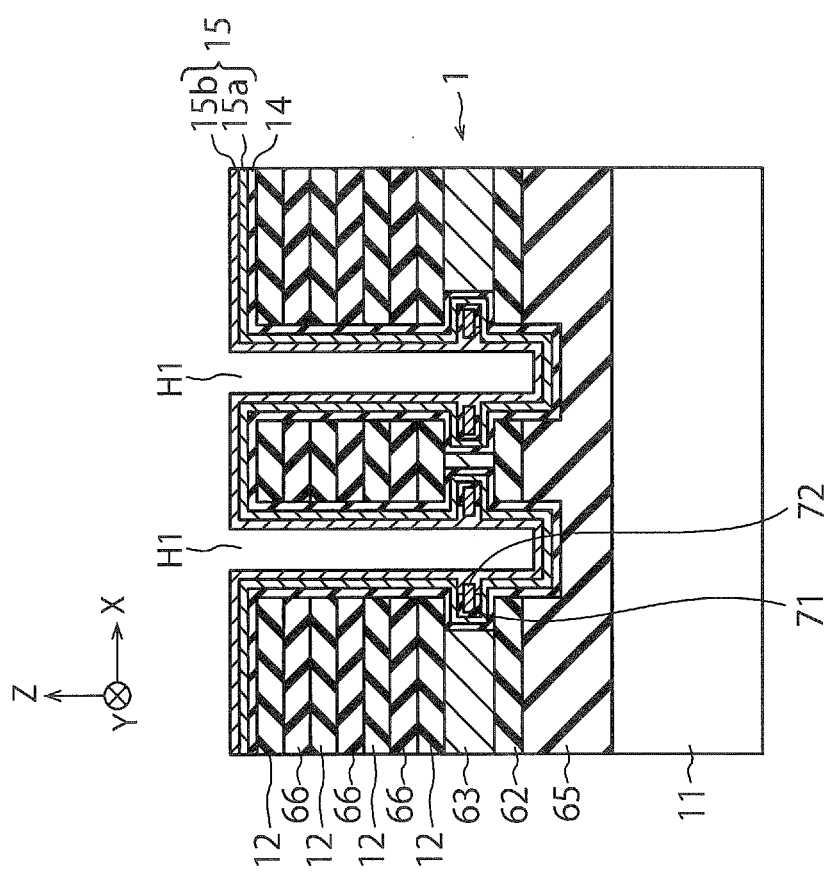
Figure 19A:
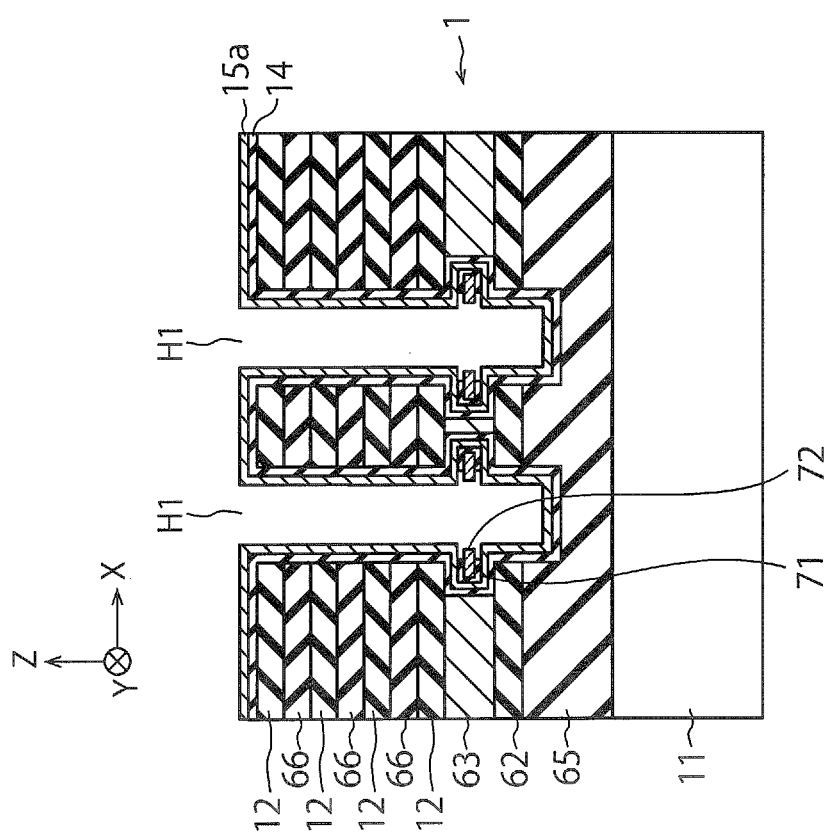

Next, a portion of the diffusion layer 72 is removed by slimming and a portion of the diffusion barrier layer 71 is removed by etching (FIG. 19A). The diffusion layer 72 and diffusion barrier layer 71 are removed from the memory holes H1 and the like by being left in the cavities H3. As a result, a diffusion layer 72 having an annular shape is formed in each cavity H3.

Next, the second body layer 15b is formed on surfaces of the memory holes H1 and cavities H3 (FIG. 19B). The second body layer 15b is formed in contact with the first body layer 15a and diffusion layer 72. Hereinafter, the first and second body layers 15a and 15b will be collectively referred to as the channel semiconductor layer 15.

Next, a core insulator 73 is formed in each memory hole H1 (FIG. 20A). The core insulator 73 of the present embodiment is also formed inside the ring of the diffusion layer 72. Next, those portions of the memory insulator 14, channel semiconductor layer 15, and core insulator 73 which are outside the memory holes H1 are removed and then a cover insulator 74 is formed on the entire surface of the substrate 11 (FIG. 20A).

Next, a trench is formed in the cover insulator 74, insulating layers 12, and sacrificial layers 66, the sacrificial layers 66 are replaced with electrode layers 13 using the trench, and then an isolation insulator 64 is embedded in the trench (FIG. 20B).

Next, the cover insulator 74 is removed and contact plugs 16, a via plug 17, an inter layer dielectric 28, and the like are formed on the substrate 11 (FIG. 21A). In the process of FIG. 21 An interconnection layers 21, a via plug 22, interconnection layers 23, via plugs 24, interconnection layers 25, via plugs 26, metal pads 27, and the like are further formed on the substrate 11, which, however, are not shown.

Next, a non-illustrated circuit wafer 2 is prepared and the array wafer 1 is bonded to the circuit wafer 2 (FIG. 21B). The circuit wafer 2 of the present embodiment is similar in structure to the circuit wafers 2 of the first to third embodiments, so the structure of the circuit wafer 2 of the present embodiment is not shown. It should be noted that the array wafer 1 of FIG. 21B is opposite in orientation to the array wafer 1 of FIG. 21A. Next, the substrate 11 is removed by CMP, and the underlying insulator 65 is removed by etchback (FIG. 21B). As a result, the memory insulator 14 of each columnar portion CL is exposed.

Figure 22A:
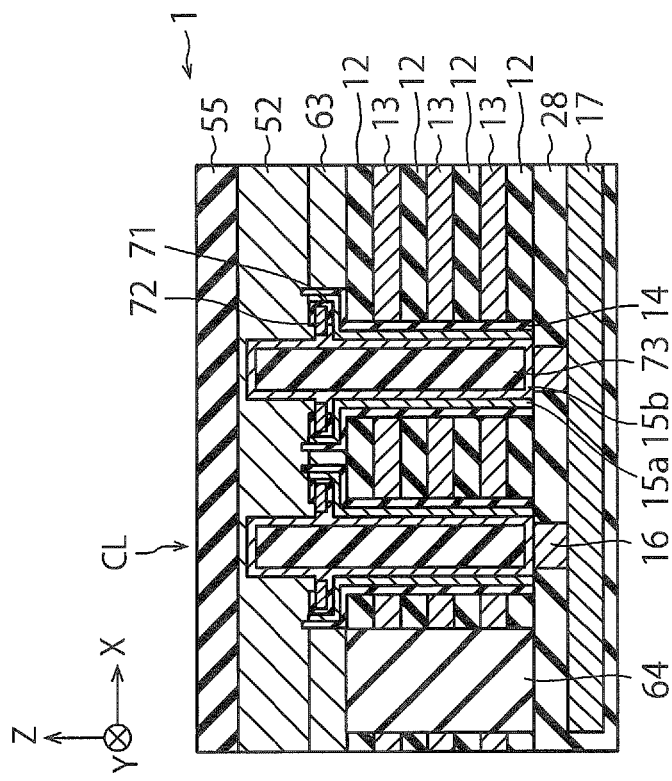

Next, the inter layer dielectric 62 is removed by etchback and at the same time, a portion of the memory insulator 14, first body layer 15a, and diffusion barrier layer 71 of each columnar portion CL is removed by etchback (FIG. 22A). As a result, the diffusion layer 72 and channel semiconductor layer 15 of each columnar portion CL are exposed.

Figure 22B:
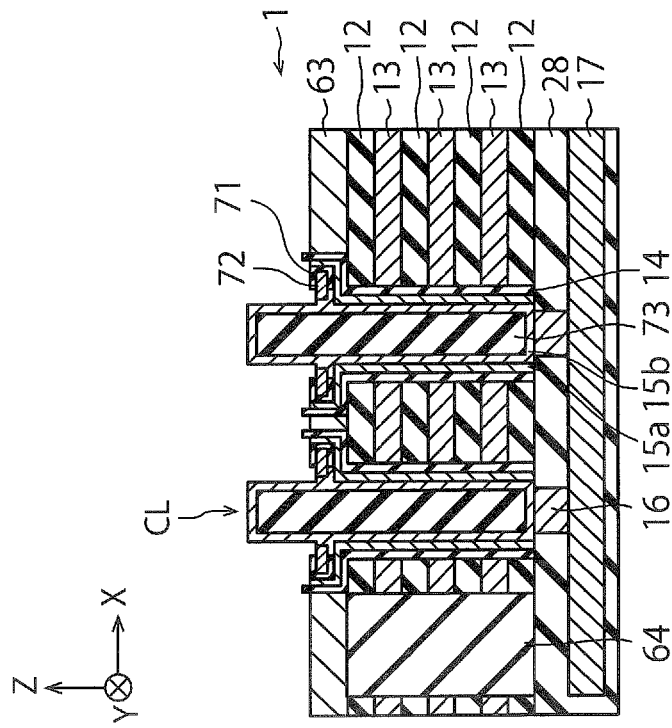

Next, a metal layer 52 and insulator 55 are formed in sequence on the entire surface of the substrate 31 (FIG. 22B). As a result, the metal layer 52 is formed on a surface and the like of the diffusion layer 72 of each columnar portion CL and the diffusion layer 72 and metal layer 52 are electrically interconnected. The diffusion layer 72 and metal layer 52 function as source layers.

Each columnar portion CL of FIG. 22B includes the core insulator 73, channel semiconductor layer 15 provided around the core insulator 73, diffusion layer 72 provided around the channel semiconductor layer 15 (around the second body layer 15b), and memory insulator 14 provided around the channel semiconductor layer 15 and diffusion layer 72. The memory insulator 14 includes a tunnel insulator 14c, charge storage layer 14b, and block insulator 14a provided in sequence around the channel semiconductor layer 15 and diffusion layer 72 and has an annular shape (see FIG. 3). In this way, the present embodiment makes it possible to form a columnar portion CL different in shape from the columnar portion CL of the third embodiment.

Subsequently, the array wafer 1 and circuit wafer 2 are diced into plural semiconductor chips. In this way, the semiconductor devices (semiconductor chips) of the present embodiment are manufactured.

As described above, according to the present embodiment, the array wafer 1 is bonded on the circuit wafer 2 after the diffusion layers 72 located around the channel semiconductor layers 15 are formed. Therefore, the present embodiment makes it possible to connect the diffusion layers 72 appropriately to the channel semiconductor layers 15 as with the first to third embodiments. For example, the present embodiment makes it possible to connect the diffusion layers 72 to the channel semiconductor layers 15 in a simple manner while curbing the various problems of the comparative example.

Fifth Embodiment

FIGS. 23A and 23B are sectional views explaining a method of manufacturing a semiconductor device of a fifth embodiment. The present embodiment is a variation of the third embodiment.

FIG. 23A shows an array wafer 1 of a comparative example of the present embodiment, specifically, an array wafer 1 similar in structure to the comparative example in FIG. 4. In FIG. 23A, unlike FIG. 4, each columnar portion CL includes a core insulator 73, and that portion of the channel semiconductor layer 15 which is near an inner surface of the intermediate semiconductor layer 61c has been removed. As a result, the intermediate semiconductor layer 61c of FIG. 23A is in contact with the bottom (lower portion) of the channel semiconductor layer 15. Therefore, the structure in FIG. 23A acts as a GIDL (Gate Induced Drain Leakage) generator.

FIG. 23B shows an array wafer 1 of the present embodiment, specifically, an array wafer 1 similar in structure to the third embodiment of FIG. 17. However, it should be noted that the array wafer 1 of FIG. 23B is illustrated in opposite orientation to the array wafer 1 of FIG. 17. In FIG. 23B, unlike FIG. 17, the diffusion layer 72, a portion of the diffusion barrier layer 71, a portion of the channel semiconductor layer 15, and a portion of the memory insulator 14 have been removed. Besides, as source layers 76, the array wafer 1 of FIG. 23B includes a lower semiconductor layer 76a similar to the lower semiconductor layer 61b, an intermediate semiconductor layer 76b similar to the intermediate semiconductor layer 61c, and an upper semiconductor layer 76c similar to the upper semiconductor layer 61d. As a result, the intermediate semiconductor layer 76b of FIG. 23B is in contact with the bottom (lower portion) of the channel semiconductor layer 15. Therefore, the structure in FIG. 23B also acts as a GIDL generator. It should be noted that according to the present embodiment, the cavity H2 is located in the intermediate semiconductor layer 76b.

The source layers 76 of FIG. 23B include a first region R1 provided below plural columnar portions CL and plural second regions R2 projecting from the first region R1 to the bottoms of the channel semiconductor layers 15 of the individual columnar portions CL. FIG. 23B illustrates one of the columnar portions CL and one of the second regions R2. The second regions R2 are in contact with the bottoms of the channel semiconductor layers 15 of the respective columnar portions CL. It should be noted that when the array wafer 1 of the present embodiment is illustrated in the same orientation as FIG. 17, the first region R1 will be located "above" the plural columnar portions CL. The source layers 76 of the present embodiment can be formed, for example, by performing a replacement process similar to the one used to form the source layers 61 of FIG. 4 in the process of FIG. 17. The source layers 76 of the present embodiment is an example of the second semiconductor layer.

Figure 24A:
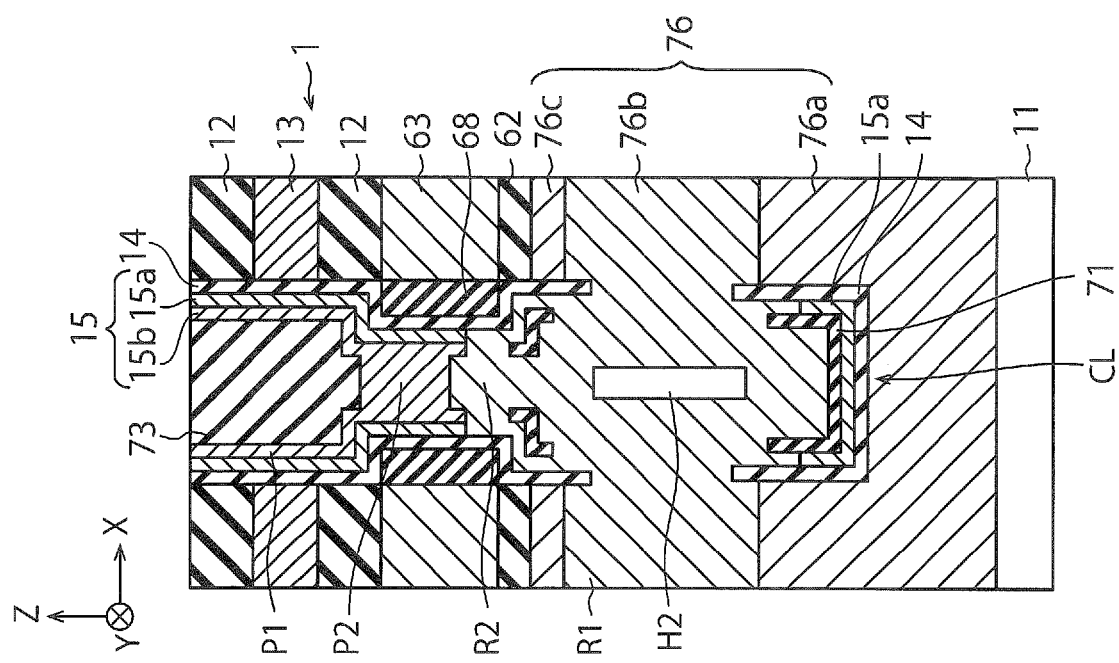
FIGS. 24A and 24B are other sectional views explaining the method of manufacturing a semiconductor device of the fifth embodiment.
Figure 24B:
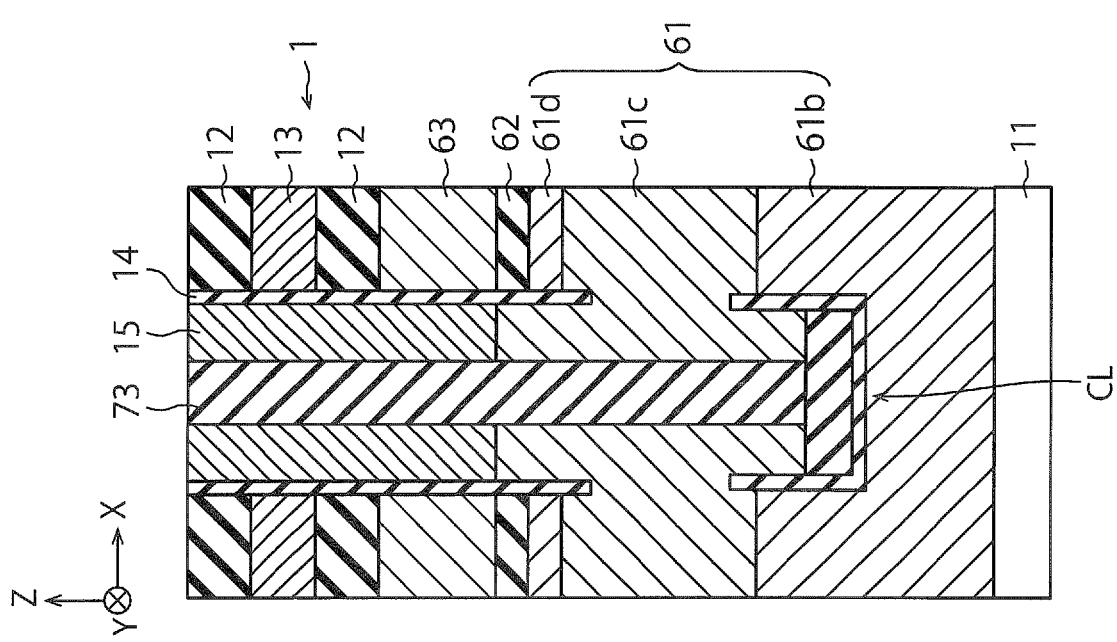

FIGS. 24A and 24B are other sectional views explaining the method of manufacturing a semiconductor device of the fifth embodiment.

FIG. 24A shows the same array wafer 1 as FIG. 23A. However, the columnar portion CL of FIG. 24A is formed at a position more distant from the isolation insulator 64 than is the columnar portion CL of FIG. 23A. Consequently, the bottom of the channel semiconductor layer 15 in FIG. 24A is less subject to the influence of the replacement process and is placed at a position lower than in FIG. 23A. This will cause a difference in GIDL between the columnar portion CL of FIG. 23A and the columnar portion CL of FIG. 24A.

FIG. 24B shows the same array wafer 1 as FIG. 23B. However, the columnar portion CL of FIG. 24B is formed at a position more distant from the isolation insulator 64 than is the columnar portion CL of FIG. 23B. Consequently, the bottom of the channel semiconductor layer 15 in FIG. 24B is less subject to the influence of the replacement process, and is placed at a position lower than in FIG. 23B, but the difference in height is not as great as that of the comparative example. Therefore, the present embodiment can reduce the difference in GIDL between the columnar portion CL of FIG. 23B and the columnar portion CL of FIG. 24B.

In this way, by modifying the structure of the third embodiment, the present embodiment makes it possible to implement a semiconductor device having an outstanding structure from the perspective of GIDL.

While certain embodiments have been described, these embodiments have been presented by way of example only, and are not intended to limit the scope of the inventions.

Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device of comprising:
a first substrate;
a plurality of electrode layers provided above the first substrate and stacked in a first direction;
a first semiconductor layer extending in the first direction in the plurality of electrode layers;
a metal layer provided above an uppermost one of the plurality of electrode layers and extending to cross the first direction; and
a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer,
the device comprising, as the first semiconductor layer, a plurality of first semiconductor layers provided in an array in an in-plane direction of the plurality of electrode layers,
wherein the second semiconductor layer is electrically connected to each of the plurality of first semiconductor layers.

2. The device of claim 1, wherein
the first semiconductor layer has a columnar shape extending in the first direction; and
the second semiconductor layer has a columnar shape extending in the first direction on the first semiconductor layer.

3. The device of claim 1, wherein
the first substrate is provided in a first chip that includes a logic circuit; and
the plurality of electrode layers are provided in a second chip that is provided on the first chip and includes a memory cell array.

4. A semiconductor device comprising:
a first substrate;
a plurality of electrode layers provided above the first substrate and stacked in a first direction;
a first semiconductor layer extending in the first direction in the plurality of electrode layers;
a metal layer provided above an uppermost one of the plurality of electrode layers and extending to cross the first direction; and
a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer,
wherein the metal layer annularly surrounds the second semiconductor layer.

5. A semiconductor device comprising:
a first substrate;
a plurality of electrode layers provided above the first substrate and stacked in a first direction;
a first semiconductor layer extending in the first direction in the plurality of electrode layers;
a metal layer provided above an uppermost one of the plurality of electrode layers and extending to cross the first direction; and
a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer,
wherein the second semiconductor layer annularly surrounds the first semiconductor layer.

6. A semiconductor device comprising:
a first substrate;
a plurality of electrode layers provided above the first substrate and stacked in a first direction;
a first semiconductor layer extending in the first direction in the plurality of electrode layers;
a metal layer provided above an uppermost one of the plurality of electrode layers and extending to cross the first direction; and
a second semiconductor layer including an impurity diffusion layer that is provided between the first semiconductor layer and the metal layer, electrically connects the first semiconductor layer with the metal layer, and has an impurity concentration higher than an impurity concentration of the first semiconductor layer,
wherein
the first semiconductor layer includes a first portion provided around a side face of a first insulator, and a second portion provided on the first insulator and the first portion; and
the second semiconductor layer is provided on the second portion.

7. The device of claim 6, further comprising a second insulator provided around a side face of the second portion to form an annular shape.

8. The device of claim 6, wherein the second semiconductor layer includes:
a first region provided above a plurality of first semiconductor layers; and
a plurality of second regions projecting from the first region toward upper portions of individual ones of the first semiconductor layers.

9. A semiconductor device comprising:
a first substrate;
a plurality of electrode layers provided above the first substrate, stacked to be spaced away from one another in a first direction that crosses a surface of the first substrate, and extending orthogonal to the first direction;
a first semiconductor layer provided in the plurality of electrode layers, and extending in the first direction; and
a second semiconductor layer provided around the first semiconductor layer to form an annular shape, electrically connected to the first semiconductor layer, and having an impurity concentration higher than an impurity concentration of the first semiconductor layer,
the device comprising, as the first semiconductor layer, a plurality of first semiconductor layers provided in an array in an in-plane direction of the plurality of electrode layers,
wherein the second semiconductor layer is electrically connected to each of the plurality of first semiconductor layers.

10. The device of claim 9, further comprising a charge storage layer provided around the first and second semiconductor layers to form an annular shape.

11. The device of claim 9, wherein
the first substrate is provided in a first chip that includes a logic circuit; and
the plurality of electrode layers are provided in a second chip that is provided on the first chip and includes a memory cell array.

12. A semiconductor device comprising:
a first substrate;
a plurality of electrode layers provided above the first substrate, stacked to be spaced away from one another in a first direction that crosses a surface of the first substrate, and extending orthogonal to the first direction;
a first semiconductor layer provided in the plurality of electrode layers, and extending in the first direction; and
a second semiconductor layer provided around the first semiconductor layer to form an annular shape, electrically connected to the first semiconductor layer, and having an impurity concentration higher than an impurity concentration of the first semiconductor layer,
wherein the second semiconductor layer annularly surrounds the first semiconductor layer.

* * * * *